(12) United States Patent
Tzeng et al.

(10) Patent No.: US 12,204,838 B2
(45) Date of Patent: Jan. 21, 2025

(54) STRUCTURE AND METHOD FOR TYING OFF DUMMY GATE IN SEMICONDUCTOR DEVICE

(71) Applicant: TAIWAN SEMICONDUCTOR MANUFACTURING COMPANY LTD., Hsinchu (TW)

(72) Inventors: Jiann-Tyng Tzeng, Hsinchu (TW); Shih-Wei Peng, Hsinchu (TW); Meng-Hung Shen, Hsinchu County (TW); Wei-An Lai, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 519 days.

(21) Appl. No.: 17/674,266

(22) Filed: Feb. 17, 2022

(65) Prior Publication Data

US 2023/0259685 A1 Aug. 17, 2023

(51) Int. Cl.
*G06F 30/392* (2020.01)
*G06F 30/398* (2020.01)

(52) U.S. Cl.
CPC .......... *G06F 30/392* (2020.01); *G06F 30/398* (2020.01)

(58) Field of Classification Search
USPC .................. 716/100, 110, 118, 119, 126
See application file for complete search history.

(56) References Cited

U.S. PATENT DOCUMENTS

| | | | |
|---|---|---|---|
| 11,043,495 B2* | 6/2021 | Lee | H01L 27/088 |
| 2010/0213552 A1* | 8/2010 | Liaw | H10B 10/12 |
| | | | 257/390 |
| 2019/0206893 A1* | 7/2019 | Liaw | H01L 23/5283 |
| 2022/0344463 A1* | 10/2022 | Jung | H01L 27/0886 |

* cited by examiner

*Primary Examiner* — Brian Ngo
(74) *Attorney, Agent, or Firm* — WPAT Law; Anthony King

(57) ABSTRACT

A layout method includes: providing a library comprising a first cell and a second cell, wherein each of the first and second cells includes: a first active region and a second active region extending in a first direction; a first cell-edge gate structure and a second cell-edge gate structure extending in a second direction; and a third cell-edge gate structure and a fourth cell-edge gate structure extending in the second direction, wherein each of the first and second cell further includes one of a tie-off conductive line or a tie-off marker layer on each of the first and second cell-edge gate structures. The layout method further includes: generating a design layout by placing and abutting the first cell and the second cell; updating the design layout by performing a post-processing step on the tie-off conductive line and the tie-off marker layer of each of the first and second cells.

20 Claims, 25 Drawing Sheets

STRUCTURE AND METHOD FOR TYING OFF DUMMY GATE IN SEMICONDUCTOR DEVICE

BACKGROUND

Electronic equipment involving semiconductor devices is essential for many modern applications. Technological advances in materials and design have produced generations of semiconductor devices, in which each generation includes smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductor devices. The manufacturing of a semiconductor device becomes more complicated in a miniaturized scale, and the increase in complexity of manufacturing may cause deficiencies such as high yield loss, reduced reliability of electrical interconnection and low testing coverage. Therefore, there is a continuous need to modify the structure and manufacturing method of the devices in electronic equipment in order to improve device robustness as well as reduce manufacturing cost and processing time.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
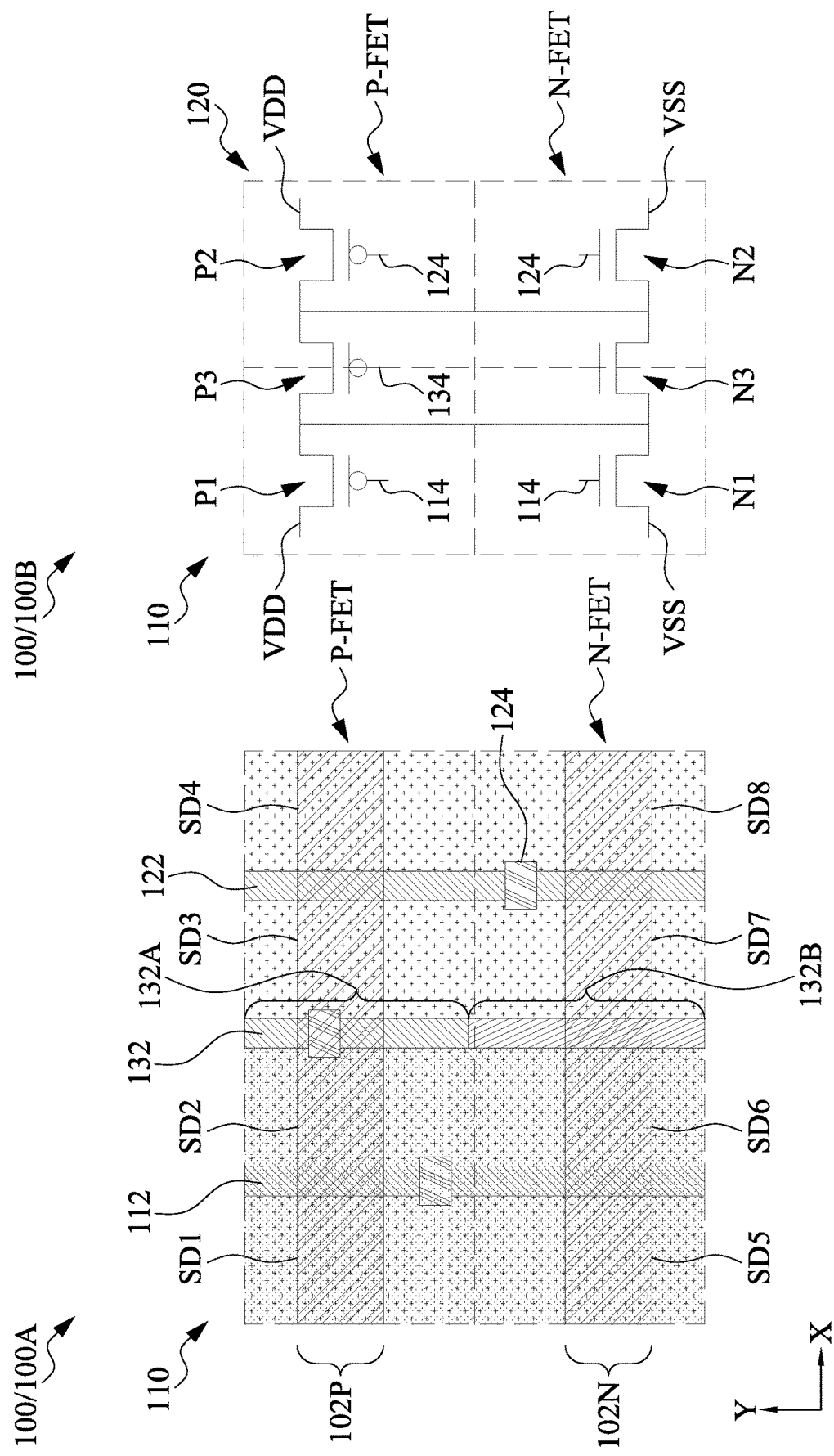
FIG. 1 shows a design layout and a circuit diagram associated with an electronic circuit, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The term "standard cell" or "cell" used throughout the present disclosure refers to a group of circuit patterns in a design layout to implement specific functionalities of a circuit. A standard cell is comprised of various patterns in one or more layers and may be expressed as unions of polygons. A design layout may be initially constructed by an array of identical or different standard cells during the layout design stage. The geometries of the patterns in the cells may be adjusted at different stages of layout design in order to compensate for design and process effects. A standard cell may implement a portion or an entirety of an electronic circuit to be manufactured. The standard cells may be accessible from cell libraries provided by semiconductor circuit manufacturers or designers. Throughout the present disclosure, the standard cells are designed for implementing electronic circuits formed by semiconductor devices, e.g., a metal-oxide-semiconductor (MOS) device, and can be a planar field-effect transistor (FET) device, a fin-type FET (FinFET) device, a gate-all-around (GAA) FET device, a nanosheet FET device, a nanowire FET device, a fully-depleted silicon-on-isolator (FDSOI) device, or the like. In some embodiments, the standard cells are included in a standard cell library, which may be stored in a non-transitory computer-readable storage medium and accessed by a processor in a layout operation.

Embodiments of the present disclosure discuss a layout method and a layout system for improving current leakage issues resulting from cell-boundary gate structures. Embodiments of the present disclosure also discuss a method of manufacturing a semiconductor device for implementing the aforesaid design layout. When a design layout associated with an electronic circuit is generated by placing a plurality of cells in the design layout and abutting the cells with appropriate locations and dimensions, the cell boundaries between the cells are generally defined by dummy gate structures. A cell usually includes a P-type FET (P-FET) region and an N-type FET (N-FET) region. In order to manage the leakage level caused by the dummy gate structures, the dummy gate structures are tied-off (turned off) through appropriate tie-off schemes. In the present disclosure, the dummy gate structures at the cell boundaries corresponding to the P-FET region and the N-FET region are implemented using different gate structure materials and configurations for achieving better leakage control in the respective P-FET and the N-FET regions. In addition, a tie-off scheme is proposed by turning off the dummy gate formed at the cell boundary between adjacent P-FET regions of neighboring cells. The performance of the P-FET is improved accordingly. As a result, the performances of the N-FET and the P-FET can be optimized individually without being compromised by the common cell-boundary gate structure design.

FIG. 1 shows a design layout 100A and a circuit diagram 100B associated with an electronic circuit 100, in accordance with some embodiments of the present disclosure. In some embodiments, the electronic circuit 100 includes one or more of a NAND gate device, an inverter gate, an XOR gate, an AND gate, a NOR gate, an And-Or-Inverter (AOI) gate, or other suitable logic gate devices Referring to the design layout 100A, the electronic circuit 100 is formed of cells 110 and 120. Each of the cells 110 and 120 includes a P-FET having a first active region 102P and a second active region 102N extending in a horizontal direction, e.g., X-axis. The first active region 102P has a conductivity type, e.g., P-type, different from the conductivity type, e.g., N-type, of the second active region 102N. The cells 110 and 120 further include gate structures 112 and 122, respectively. The gate structures 112 and 122 are configured as functional gate structures and extend in a vertical direction, e.g., Y-axis. The cell 110 may include a conductive via 114 electrically connected to the gate structure 112 to bias the gate structure 112 with a biasing voltage. Likewise, the cell 120 may include a conductive via 124 electrically connected to the gate structure 122 to bias the gate structure 122 with a biasing voltage. As illustrated in FIG. 1, the cell 110 has a right cell side abutting a left cell side of the cell 120, where the cell boundary between the cells 110 and 120 is defined by a gate structure 132. The gate structure 132, which is referred to as a cell-edge gate structure, is configured as a non-functional or dummy gate structure. Other features of the cells 110 and 120 are omitted from the design layout 100A for brevity. Throughout the present disclosure, the features in the drawings are labelled with respective numerals for ease of reference. For some features labelled with difference reference numerals but illustrated in similar hatching patterns, it is not intended to imply that they share the same configuration or material.

Referring to the design layout 100A and the circuit diagram 100B, in the P-FET region 102P, the gate structure 112 and the P-FET region 102P of the design layout 100A correspond to a P-FET P1 in the circuit diagram 100B, in which the portions of the P-FET region 102P non-overlapped with the gate structure 112 form two source/drain regions SD1 and SD2. The source/drain regions SD1 and SD2 and the conductive via 114 may correspond to a source terminal, a drain terminal and a gate terminal, respectively, of the P-FET P1. Similarly, the gate structure 122 and the P-FET region 102P of the design layout 100A correspond to a P-FET P2 in the circuit diagram 100B, in which the portions of the P-FET region 102P non-overlapped with the gate structure 122 form two source/drain regions SD3 and SEM. The source/drain regions SD3 and SD4 and the conductive via 124 may correspond to a source terminal, a drain terminal and a gate terminal, respectively, of the P-FET P2.

In the N-FET region of the design layout 100A, the gate structure 112 and the N-FET region 102N of the design layout 100A correspond to an N-FET N1 in the circuit diagram 100B, in which the portions of the N-FET region 102N non-overlapped with the gate structure 112 form two source/drain regions SD5 and SD6. The source/drain regions SD5 and SD6 and the conductive via 114 may correspond to a source terminal, a drain terminal and a gate terminal, respectively, of the N-FET N1. Similarly, the gate structure 122 and the N-FET region 102N of the design layout 100A correspond to an N-FET N2 in the circuit diagram 100B, in which the portions of the N-FET region 102N non-overlapped with the gate structure 122 form two source/drain regions SD7 and SD8. The source/drain regions SD7 and SD8 and the conductive via 124 may correspond to a source terminal, a drain terminal and a gate terminal, respectively, of the N-FET N2.

Referring to the circuit diagram 100B, the drain terminals and source terminals of the P-FETs and N-FETs in the electronic circuit 100 are properly biased to maintain the functionality of the P-FETs and N-FETs. In some embodiments, the source terminals of the P-FETs P1 and P2 are biased at a first supply voltage VDD, and the drain terminals of the N-FETs N1 and N2 are biased at a second supply voltage VSS. In some embodiments, the first supply voltage VDD is a positive voltage and the second supply voltage VSS is ground. Referring to the design layout 100A, the source/drain regions, e.g., SD1, SD4, SD5 and SD8, may be electrically connected to the supply voltages VDD or VSS through one or more interconnected conduction path (not separately shown in the design layout 100A) in correspondence with the biasing arrangement in the circuit diagram 100B.

In some embodiments, the gate structure 132 is partitioned into two portions, i.e., a first portion 132A in the P-FET region and a second portion 132B in the N-FET region. Throughout the present disclosure, the portion 132A or 132B of the gate structure 132 is also referred to as a gate structure 132A or 132B for ease of reference. Since the active region 112P or 112N is formed in a contiguous region across adjacent cells 110 and 120, one or more dummy FET may be inevitably formed at the cell boundary between the cells 110 and 120. For example, the gate structure 132A and the source/drain regions SD2 and SD3 may form a P-FET P3, and the gate structure 132B and the source/drain regions SD6 and SD7 may form an N-FET N3. The FETs P3 and N3 are not desired for the electronic circuit 100 since they do not serve functions and may consume power due to leakage.

In some embodiments, the gate structures 112 and 122 include a high-k gate dielectric layer and a gate electrode layer for providing switching functions of the respective P-FET or N-FET. In addition, the gate structure 112 or 122 straddles the active region 102P or 102N, in which the portion of the active region 102P or 120N overlapped with the gate structure 112 or 122 is defined as a channel of the respective P-FET or N-FET. In contrast, the gate structure 132B is formed using a material and a configuration different from those for the functional gate structures 112 and 122. In the present disclosure, the gate structure 132B in the N-FET region is implemented by a dummy gate structure, e.g., a continuous poly on diffusion edge (CPODE) gate structure. The CPODE gate structure is formed of an electrically insulating material or a dielectric material, e.g., silicon oxide, silicon nitride, silicon carbide, silicon oxynitride, polymers, or the like. The CPODE gate structure extends through the active region 102N in the N-FET region to thereby break contiguous active region 102N into two noncontiguous layers. Therefore, no channel is left at the boundary between the cells 110 and 120 since the areas originally occupied by the active region 102N and the gate structure 132B are replaced with a dielectric material of the CPODE. As a result, the N-FET N3 that is otherwise present in the electronic circuit 100 will no longer exist. The tie-off scheme for the dummy N-FET N3 is achieved by eliminating the functional gate structure of the N-FET N3, and the leakage issue resulting from the N-FET N3 is resolved.

However, although the CPODE gate structure 132B functions well with the N-FETs N1 and N2, the formation of the gate structure 132A may change the strained effect of the source/drain regions SD1 through SD4 of the P-FETs P1 and P2 if the gate structure 132A is implemented using the CPODE structure. The stress of the source/drain regions SD1 through SD4 for the P-FETs P1 and P2 may not be well controlled due to the layout-dependent effect in the presence of the CPODE gate structure 132A. The performance of the P-FETs P1 and P2 may therefore be inferior to that of the N-FETs N1 and N2 more than expected, especially in a small-pitch P-FET design for an advanced technology node.

To maintain the performance of the P-FETs P1 and P2 at an acceptable level and close to that of the N-FETs N1 and N2, the dummy P-FET P3 is formed by a different tie-off scheme, referred to herein as a continuous oxide diffusion (CNOD) gate structure. The CNOD gate structure allows the gate structure 132A to be formed of the materials and configurations the same as those of the gate structures 112 and 122, in which the CNOD gate structure include one or more conductive material. As a result, since the active region 102P is not broken at the cell boundary between the cells 110 and 120, the active region 102P is contiguous across the cell boundary between the cells 11 and 120. Since the gate structure 132A can function normally, the dummy P-FET P3 may behave like a normal P-FET. Therefore, the dummy P-FET P3 should be tied off properly. That means the gate terminal of the P-FET P3 should be set as logical 'high' to keep the P-FET P3 turned off in all times. As an example, to achieve the goal of tying off the P-FET P3 properly at all times, the gate structure 132A is electrically biased at the first supply voltage VDD through an interconnection path including a conductive via 134 formed on the gate structure 132A. In some embodiments, the interconnection path for tying off the P-FET P3 should be adapted to the configurations of the cells 110 and 120 in order to comply with the design rule and reducing the resistance of the interconnection path. As a result, the interconnection path may have different configurations, descriptions of which are provided in greater detail with reference to subsequent figures.

Figure 2:
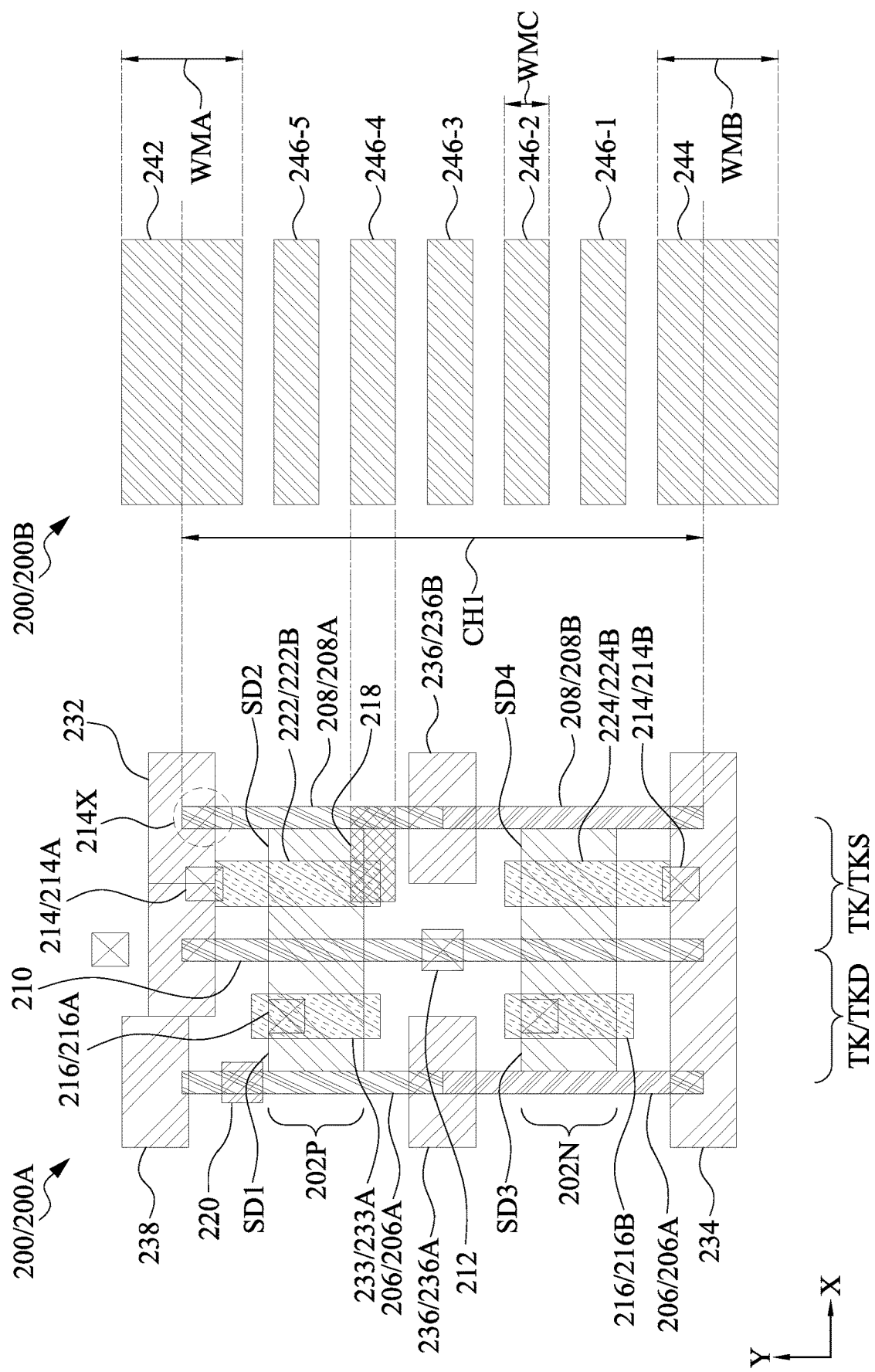
FIG. 2 shows design layouts of a cell, in accordance with some embodiments of the present disclosure.
Figure 3:
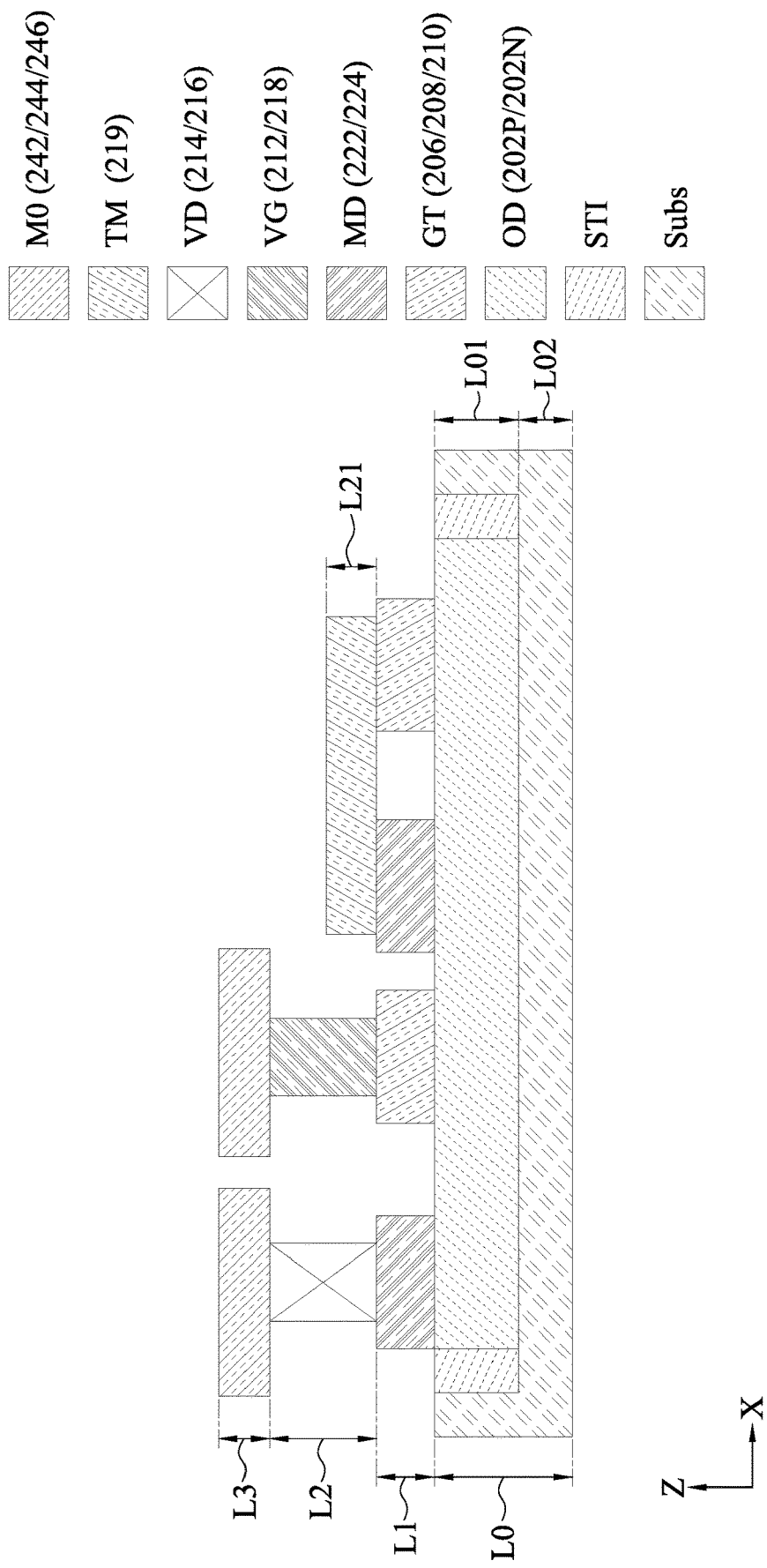
FIG. 3 is a cross-sectional view showing a vertical layer arrangement of a semiconductor device, in accordance with some embodiments of the present disclosure.

FIG. 2 shows design layouts 200A and 200B of a cell 200 in different layers, in accordance with some embodiments of the present disclosure. Referring to FIG. 2, multiple layers overlay one another along with various patterns in the respective layers, as illustrated in the design layout 200A from a top-view perspective, while a conductive line layer alone is illustrated in the design layout 200B from a top-view perspective for clarity of illustration. FIG. 3 is a cross-sectional view 300A showing a vertical arrangement of the patterns in the respective layers of the cell 200, in accordance with some embodiments of the present disclosure.

The cell 200 is implemented by a semiconductor device formed of multiple device layers overlaying over one another, and FIG. 3 illustrates part of the device layers, e.g., layers L0, L1, L2 and L3. Referring to FIG. 3, a substrate layer L0 is formed or provided, in which a substrate, denoted by "Subs" in FIG. 3, may be a silicon substrate or other suitable semiconductor substrate. An active region, denoted by "OD" in FIG. 3, is arranged in the substrate layer L0 and exposed through an upper surface of the substrate layer L0. Although not separately shown, the active region OD may include a first source/drain region, a second source/drain region and a channel of the cell 200 interposed between the two source/drain regions. The source/drain regions in the active region may be an N-type active region doped with N-type impurities such as arsenic, phosphorus, or the like, or a P-type active region doped with P-type impurities such as boron or the like. The channel in the active region may be undoped or lightly doped. In some embodiments where a raised active region or a Fin-EFT device is involved, the active region OD may have an upper surface higher than the upper surface of the substrate layer L0. In some embodiments, the substrate layer L0 further includes isolation structures, denoted by "STI" in FIG. 3, defining and laterally surrounding the active region OD. In some embodiments, the isolation structures are formed of dielectric materials, such as oxide or nitride, and may be referred to as shallow trench isolation (STI).

A gate structure GT is formed in the gate layer L1 over the active region OD. The gate structure GT may include a gate dielectric layer and a gate electrode. The gate dielectric layer may be formed of dielectric materials, such as a high-k dielectric material, and arranged between the channel and the gate electrode. The gate electrode may include a conductive material, such as doped polysilicon or a metal gate comprising metallic materials such as tungsten, and cobalt, and other work function adjusting metals, such as Ti, Al, TiAl, TiN, TaC, and the like. In some embodiments where a FinFFT or GAA FET is involved, the material of the substrate is present only in the lower sublayer L02 of the substrate layer L0, and the active region OD is formed in an upper sublayer L01 of the substrate layer L0. The gate structure GT may extend from the gate layer L1 to the upper sublayer L01, and the gate layer L1 and the upper sublayer L01 may be combined.

Further, a gate-layer conductive line, denoted by "MD" in FIG. 3, is also shown in the gate layer L1 over the active region OD adjacent to the gate structure GT. In some embodiments, the gate-layer conductive line extends in the direction of the V-axis and is parallel to the direction where the gate layer extends.

A plurality of conductive line layers and a plurality of conductive via layers are provided over the gate layer L1. FIG. 3 only shows one conductive line layer L3 and one conductive via layer L2 as an example. Each of the conductive line layers includes a plurality of parallel conductive lines, e.g., conductive line "M0", and each of the conductive via layers includes conductive vias, e.g., gate via "VG" and drain via "VD." The conductive lines M0 (including the gate-layer conductive line MD) and the conductive vias VG and VD may be formed of conductive materials, such as copper, tungsten, aluminum, titanium, tantalum, alloys thereof, or the like. The conductive line layers are electrically interconnected through the intervening conductive via layers. For example, the conductive line layer L3 is arranged over and connected to upper conductive line layers through a conductive via layer between the conductive line layer and an overlying conductive line layer. The conductive line layer L3 is further electrically connected to the gate layer L1 through the conductive via layer L2 therebetween, in which a conductive line M0 in the conductive line layer L3 is electrically connected to the gate structure GT through the gate via VG and another conductive line M0 is electrically connected to the gate-layer conductive line MD through the drain via VD. The configurations and materials of the conductive line layer L3 and conductive via layer L2 shown in FIG. 3 are for illustrative purposes only. Other numbers of conductive line and via layers, materials, and configurations of the cell 200 is within the contemplated scope of the present disclosure.

Referring to 2A, the design layout 200A includes active regions (OD) 202P and 202N arranged in the substrate layer L0. The active regions 202P and 202N may extend in a row direction along the X-axis. In some embodiments, the active regions 202P and 202N are a P-type active region and an N-type active region, respectively. The active regions 202P and 202N are defined and separated from each other by isolation structures STI (not shown in FIG. 2A).

The design layout 200A includes a gate structure (GT) 210 disposed in the gate layer L1 over the active regions 202P and 202N. The gate structure 210 extends in the column direction along the Y-axis perpendicular to the X-axis. In some embodiments, the gate structure 210 serves as a functional gate structure in a FET device. Although the design layout 200A shows only one gate structure 210, the cell 200 may include more than one gate structure 210 parallel to each other and extending in the column direction of the Y-axis.

The design layout 200A further includes two cell-edge gate structures 206 and 208 in the gate layer L1 that extend in the column direction on a left cell side and a right cell side, respectively, of the cell 200. The cell-edge gate structures 206, 208 are parallel to the gate structure 210. In some embodiments, the cell-edge gate structures 206, 208 are not functioning in a FET device.

The cell-edge gate structure 206 includes a first portion 206A, also referred to as a gate structure 206A, and a second portion 206B, also referred to as gate structure 206B. The cell-edge gate structure 208 includes a first portion (gate structure) 208A and a second portion (gate structure) 208B. In some embodiments, the cell-edge gate structures 206A and 208A have a same gate structure composition and materials as those of the gate structure 210, but different from those of the gate structures 206B and 208B. As discussed previously, the gate structures 206A and 208A are associated with a P-FET and adopt the CNOD scheme, while the gate structures 206B and 208B are associated with an N-FET and adopt the CPODE scheme.

Source/drain regions SD1 and SD2 are defined in the active region 202P and delimited by the gate structure 210 and the cell-edge gate structures 206, 208. The active region 202P covered by the gate structure 210 between the source/drain regions SD1 and SD2 is defined as the channel of a P-FET. Similarly, source/drain regions SD3 and SD4 are defined in the active region 202N and delimited by the gate structure 210 and the cell-edge gate structures 206 and 208, in which the source/drain regions SD3 and SD4 correspond to the source terminal and drain terminal, respectively, of an N-FET. The active region 202N covered by the gate structure 210 between the source/drain regions SD3 and SD4 is defined as the channel of the N-FET.

Tracks TK are defined as areas of the design layout 200A from a top-view perspective between two adjacent gate structures 206, 208, 210. Each track TK is in a strip shape and extends in the column direction. For example, a track TKD is formed as a strip area defined by the cell-edge gate structure 206 and the gate structure 210, and a track TKS is formed as a strip area defined by the cell-edge gate structure 208 and the gate structure 210.

The design layout 200A also includes gate-layer conductive lines (MD) 222 and 224 arranged in the gate layer L1. The gate-layer conductive lines 222, 224 are arranged parallel to the gate structures 210 within the respective tracks TK. For example, gate-layer conductive lines 222A and 224A are arranged within the track TKD and gate-layer conductive lines 222B and 224B are arranged in the track TKS. The gate-layer conductive lines 222 or 224 arranged in the same track, e.g., the gate-layer conductive lines 222A and 224A, may be aligned in the column direction. Referring to FIG. 2 and FIG. 3, the gate-layer conductive line 222A crosses and is electrically connected to the source/drain region SD1, and the gate-layer conductive line 224A crosses and is electrically connected to the source/drain region SD3. The gate-layer conductive line 222B crosses the source/drain region SD2 and is electrically connected to the source/drain region SD2, and the gate-layer conductive line 224B crosses the source/drain region SD4 and is electrically connected to the source/drain region SD4.

Referring to the design layout 200B, the cell 200 further includes power rails (M0) 242, 244 and conductive lines (M0) 246 arranged in the conductive line layer L3 and extending in the row direction. The power rails 242, 244 and conductive lines 246, which includes conductive lines 246-1 through 246-5, are arranged in parallel, in which the power rails 242 and 244 are arranged on an upper cell side and a lower cell side, respectively, of the cell 200. In some embodiments, the power rails 242 and 244 are configured to supply the first supply voltage VDD and the second supply voltage VSS, respectively. In some embodiments, the power rail 244 is also referred to as a ground rail since it is generally electrically grounded. The power rail 242 has a width WMA measured in the column direction, the power rail 244 has a width WMB measured in the column direction, and the conductive liens 246 have a width WMC measured in the column direction. In some embodiments, the width WMA is greater than the width WMB, and the width WMB is greater than the width WMC.

As discussed with reference to FIG. 2 and FIG. 3, the power rails 242, 244 are arranged in the conductive line layer L3 over the substrate layer L0. Throughout the present disclosure, the configuration of arranging the power rails 242, 244 and the conductive lines 246 on a same side of the active regions 202 is referred to as a frontside power-ground network (PGN). The frontside PGN may be suitable for various types of FETs, e.g., planar FET, FinFET, GAA, nanosheet FET, nanowire FET, and the like.

In some embodiments, a cell height CH1 of the cell 200 measured in the column direction is defined as a pitch between the power rails 242 and 244 and is determined according to a total number of the conductive lines 246 accommodated within the design layout 200B. As shown in FIG. 2 of the depicted embodiment, the number of conductive lines 246 is five. However, other numbers of the conductive lines 246 are also within the contemplated scope of the present disclosure.

The design layout 200A also includes one or more conductive vias 212, 214, and 216 for electrically connecting the gate layer L1 to the conductive line layer L3. The conductive via 212 is arranged as a gate via VG over the gate structure 210 and electrically connects the gate structure 210 to the conductive line 246-3. The conductive vias 214A and 214B are arranged as drain vias VD over the respective power rails 242, 244 and electrically connects the gate-layer conductive lines 222B and 224B to the power rails 242 and 244, respectively. The conductive vias 216A and 216B are arranged as drain vias VD over the respective conductive lines 222A, 224A and electrically connects the gate-layer conductive lines 222A and 224A to the conductive lines 246-5 and 246-1, respectively.

In some embodiments, a track TK in a FET is referred to a source-end track, e.g., the track TKS, in which the source/drain region corresponds to a source terminal of the P-FET and is electrically connected to the first supply voltage VDD through a drain via, e.g., the drain via 214A, within the same track. Similarly, a track in a FET is referred to a drain-end track, e.g., the track TKD, in which the source/drain region corresponds to a drain terminal of a P-FET and is electrically connected to one of the conductive lines 246, instead of any power rail, through a drain via, e.g., the drain via 212A.

The design layout 200A further includes a tie-off conductive line 218, denoted by "TM" in FIG. 3, arranged in a sublayer L21 of the conductive via layer L2. For example, when the cell 200 abuts another cell CX in a placement and routing operation, a dummy P-FET may be formed between the cell 200 and the cell CX with the cell-edge gate structure 208A functioning as the gate terminal. As such, a tie-off conduction path for the cell-edge gate structure 208A is formed, in which the tie-off conductive line 218 is used to tie off the dummy P-FET by biasing the cell-edge gate structure 208A to the first supply voltage VDD. The tie-off conductive line 218 extends in the horizontal direction and electrically connects the cell-edge gate structure 208A to the power rail 242 through the gate-layer conductive line 222B and the conductive via 214A. In some embodiments, the tie-off conductive line 218 has a height measured in the height direction in the Z-axis less than a height of a conductive via 212, 214 or 216. In some embodiments, the tie-off conductive line 218 is overlapped with one of the conductive lines 246 in the column direction, e.g., the tie-off conductive line 218 overlaps the conductive line 246-4 in the column direction. However, the tie-off conductive line 218 is non-overlapped with any conductive lines 246 from a top-view perspective in order to avoid bridging defects. In some embodiments, the tie-off conductive line 218 overlapped with the conductive lines 246-4 or 246-5 in the vertical direction. The reason that the cell-edge gate structure 208A is tied off through the conductive line 218 instead of an otherwise adopted conductive via 214X at the location of a dashed circle overlapping the power rail 242 is that the spacing between the conductive via 214X and the conductive via 214A would be less than a minimal spacing value between two conductive vias of a cell determined by the design rules. If the conductive via 214X and the conductive via 214A are formed with a spacing less than a minimal spacing value, a via bridging defect may occur between the conductive vias 214X and 214A. Therefore, a design rule check operation will identify a layout violation for the conductive vias 214A and 214X and requests redesign of the tie-off conductive path for the cell-edge gate structure 208A.

The design layout 200A further includes a tie-off marker layer 220 for tying off the dummy gate structures 206 or 208. The tie-off marker layer 220 is a logical feature different from the patterns in a device layer, e.g., layers L0 through L3 of FIG. 3. The tie-off marker layer 220 may not be necessarily transformed into physical features of the cell 200. Through a logical (Boolean) operation or a post-processing step to process the tie-off marker layer 220, the layout tool will determine whether to convert the tie-off marker layer 220 into corresponding physical features in the design layout 200A, or just remove the tie-off marker layer 220. In some embodiments, the tie-off marker layer 220 is arranged at the cell boundary of the cell 200 and overlapped with the cell-edge gate structure 206A and the power rail 242. The tie-off marker layer 220 is to be processed in a subsequent post-processing step to determine whether a conductive via converted from the tie-off marker layer 220 is to be formed as part of a tie-off conduction path for the cell-edge gate structure 206A.

The design layout 200A also includes gate partition patterns 232, 234, 236, 238 extending in the row direction. The gate partition patterns 232, 234, 236 are used to break the gate structures into individual gate structures of each FET. For example, the gate partition patterns 232, 234, 238 separate the gate structures 206, 208 from the upper cell and the lower cell of the cell 200. The gate partition pattern 236A separates the gate structures 206A from the gate structure 206B, while the gate partition pattern 236B separates the gate structures 208A from the gate structure 208B. In some embodiments, the gate partition pattern 238 is overlapped with the gate partition pattern 232 while is staggered with the gate partition pattern 232 for providing extra spaces for the tie-off marker layer 220. In some embodiments, the gate partition patterns 232, 234, 236, 238 are implemented by a dielectric material, e.g., silicon nitride, silicon oxide, silicon carbide, silicon oxynitride, high-k dielectric materials, of the like.

Figure 4:
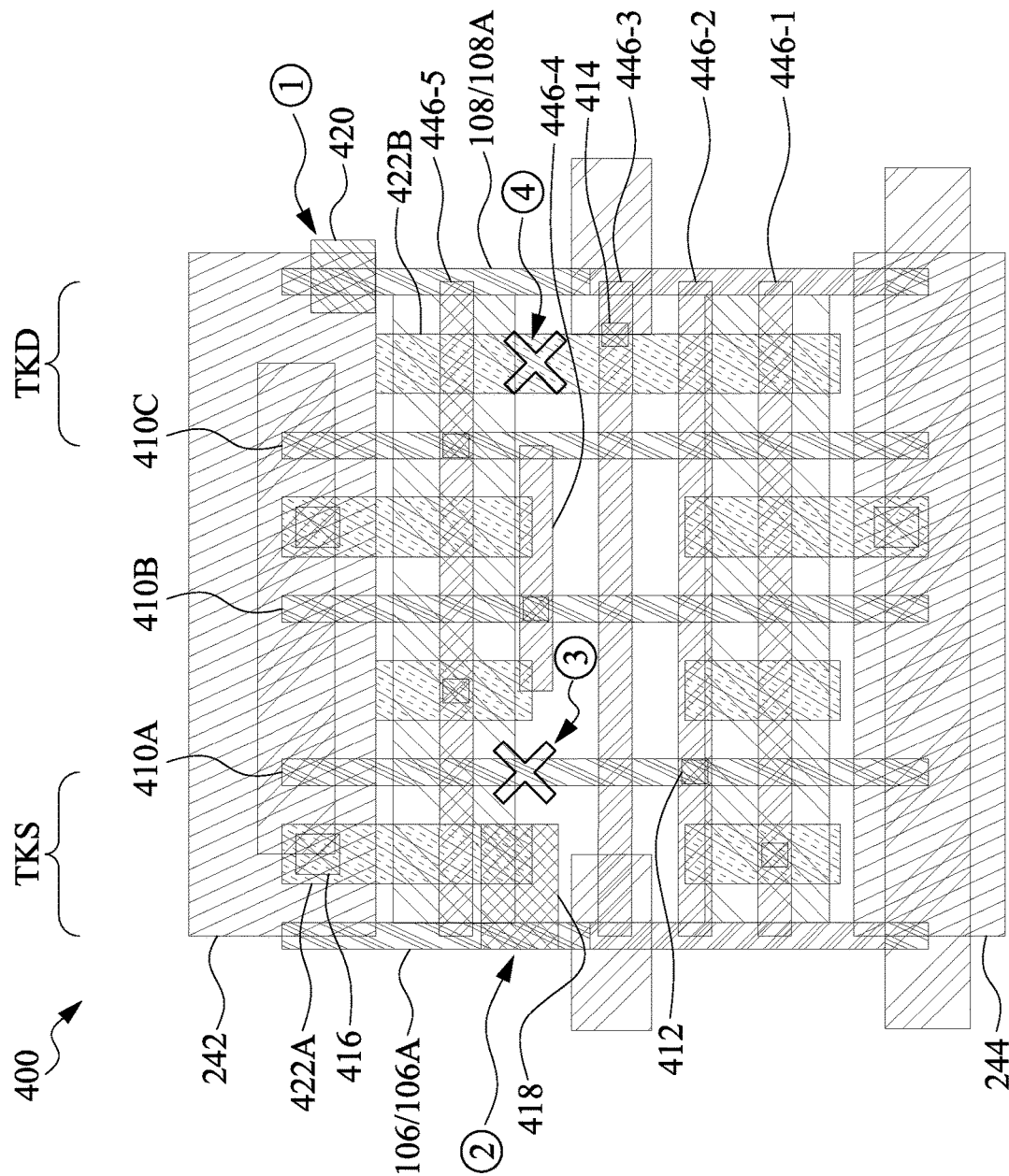
FIG. 4 is a design layout of a cell, in accordance with some embodiments of the present disclosure.

FIG. 4 is a design layout of an exemplary cell 400, in accordance with some embodiments of the present disclosure. According to the purposes of tying off the cell-edge gate structures 106A and 108A, the cell 400 is generated based on a set of design rules including at least four requirements for a frontside PGN. Three functional gate structurs 410, e.g., 410A, 410B and 410C are illsutrated between the cell-edge gate structures 106A and 106B. Initially, the layout method for generating the cell 400 identifies whether the cell-edge gate structure 106A or 108A is immediately adjacent to a source-end track TKS or a drain-end track TKD. For example, as illustrated in FIG. 4, the left-most track TK of the cell 400, which is immediately adjacent to the cell-edge gate structure 106A, is identified as a source-end track TKS since a gate-layer conductive line 422A within the left-most track TK is electrically connected to a power rail 442 through a conductive via 416, in which the conductive via 416 is overlapped with the power rail 442. Additionally, the right-most track TK of the cell 400, which is immediately adjacent to the cell-edge gate structure 108A, is identified as a drain-end track TKD since a gate-layer conductive line 422B is electrically connected to a conductive line 446-3 through a conductive via 414, instead of connected to the power rail 442.

Although the cell 400 indicates that one of the cell-edge gate structures 106A and 108A is immediately adjacent to a source-end track TKS and the other is immediately adjacent to a drain-end track TKD, other combinations of the track types are also possible. In some other embodiments, the cell-edge gate structures of a cell may be immediately adjacent to two source-end tracks TKS or two drain-end tracks TKD depend on various cell design requirements.

[Requirement #1]: Referring to the label (1) in FIG. 4, when a cell-edge gate structure, e.g., gate structure 108A, is immediately adjacent to a drain-end track TKD, a tie-off marker layer 420 is generated on the cell-edge gate structure 106A, in which the tie-off marker layer 420 overlaps the power rail 442.

[Requirement #2]: Referring to the label (2) in FIG. 4, when a cell-edge gate structure, e.g., gate structure 106A, is immediately adjacent to a source-end track TKS, a tie-off conductive line 418 is formed on one of the conductive lines 446, e.g., conductive line 446-4, to electrically connect the cell-edge gate structure 106A to the power rail 442 through the gate-layer conductive line 422A and the conductive via 416.

[Requirement #3]: Referring to the label (3) in FIG. 4, when a tie-off conductive line is provided to the cell 400 according to Requirement #2, if a gate via (e.g., gate via 412) is arranged to connect to a functional gate structure (e.g., gate structure 110A) on a side of the source-end track TKS opposite to the cell-edge gate structure, such gate via is not allowed on the same level of the conductive line (e.g., the level of the conductive line 446-4) where the tie-off conductive line (e.g., tie-off conductive line 418) resides. The prohibited connection location for the gate via 412 is shown as a cross on the conductive line 446-4. If the gate via 412 is otherwise arranged at the location of the cross sign, the spacing between the gate via 412 and the tie-off conductive line 418 would be less than the minimal spacing value specified by the design rule, and therefore a bridging defect may occur. As illustrated in FIG. 4, the gate via 412 is arranged to connect to the conductive line 446-2, and such connection arrangement would comply with the design rule.

[Requirement #4]: Referring to the label (4) in FIG. 4, when a tie-off conductive line is provided to the cell 400 according to Requirement #2, if a drain via (e.g., drain via 414) is arranged to connect to a gate-layer conductive line (e.g., gate-layer conductive line 422B) on a side of the drain-end track TKD opposite to the cell-edge gate structure, such drain via is not allowed on the same level of the conductive line where the tie-off conductive line (e.g., tie-off conductive line 418) resides. The prohibited connection location for the drain via is shown as a cross on the conductive line 446-4. If the drain via 414 is otherwise arranged at the location of the cross sign, the spacing between the drain via 414 and a potential tie-off conductive line of an adjacent cell CY at the right side of the cell 400 would be less than the minimal spacing value specified by the design rule after the cell 400 abuts the cell CY, and therefore a bridging defect may occur. As illustrated in FIG. 4, the drain via 414 is arranged to connect to the conductive line 446-3, and such connection would comply with the design rule.

FIGS. 5A to 5E are design layouts 500 in intermediate stages of performing a post-processing operation in a layout method, in accordance with some embodiments of the present disclosure. It should be understood that additional steps can be provided before, during, and after the steps shown in FIGS. 5A to 5E, and some of the steps described below can be replaced or eliminated in other embodiments of the layout method. The order of the steps may be interchangeable.

Figure 5A:
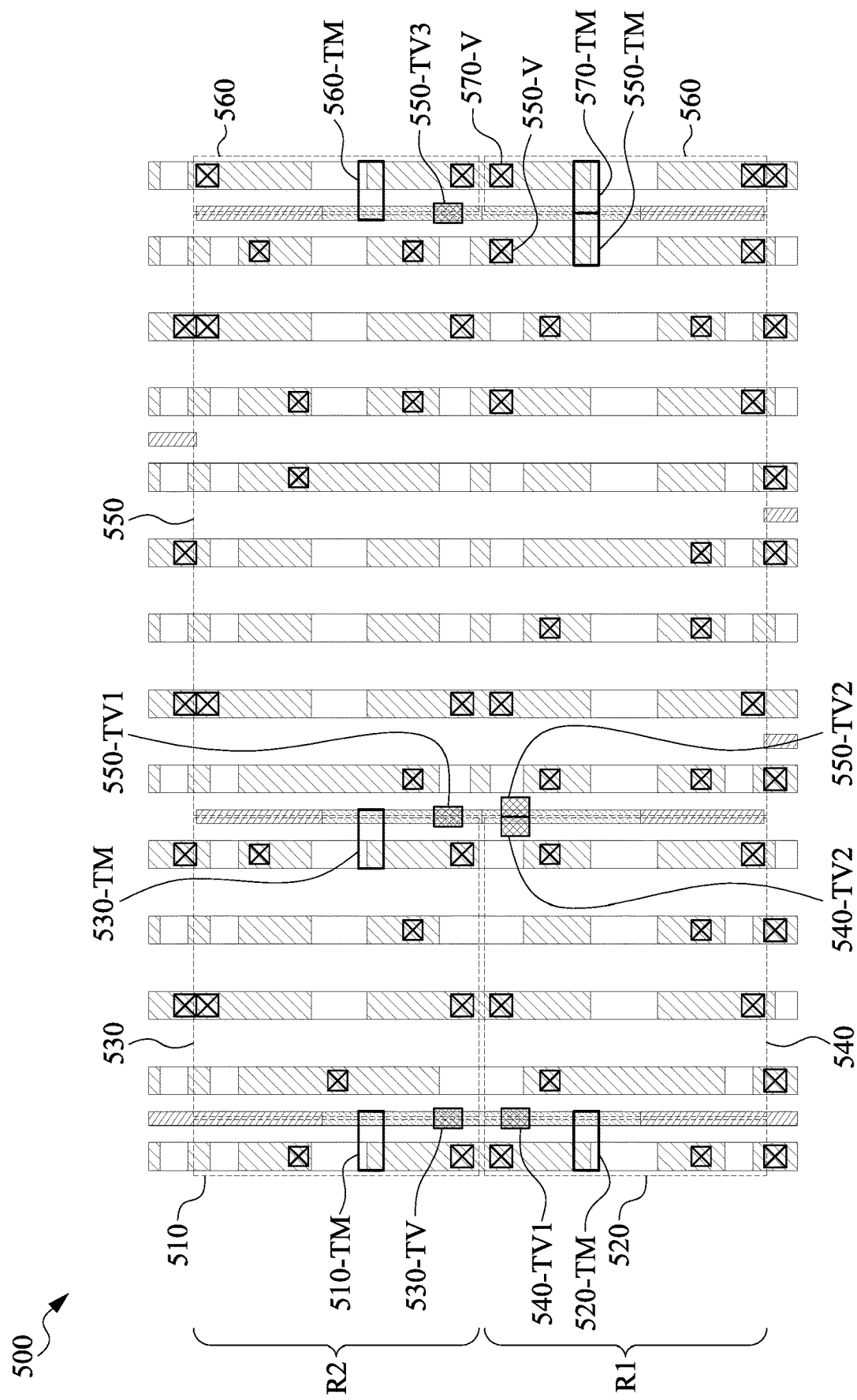
FIGS. 5A to 5E are design layouts of intermediate stages of performing a post-processing operation in a layout method, in accordance with some embodiments of the present disclosure.

Referring to FIG. 5A, a design layout 500 is generated in a placement and routing operation. The design layout 500 is generated by placing cells 510, 520, 530, 540, 550, 560 and 570 in appropriate locations. The cells 520, 540 and 570 are configured as single-height cells and placed in a first row R1, the cells 510, 530 and 560 are configured as single-height cells and placed in a second row R2, and the cell 550 is configured as a double-height cell and placed across the first and second rows R1 and R2. The cell-edge gate structures in each of the cells 510 through 570 has a two-portion structure, similar to the gate structure 132, 206 or 208 discussed above. The placement and routing operation of the layout method further abuts the cells 510 through 570 in an appropriate manner. The two overlapped cell-edge gate structures of two abutted cells merge as one merged cell-edge gate structures at the cell boundary of the adjacent cells when the two cells abut each other. Cells 510 through 570 are provided each including respective circuit patterns, details of which are omitted herein. Additionally, each of the two cell-edge gate structures in the cells 510 through 570 is associated with a tie-off conductive line or a tie-off marker layer connected thereto. For example, the cell 510 includes a tie-off conductive line 510-TM connected to a cell-edge gate structure shared by the cells 510 and 530. The cell 530 includes a tie-off marker layer 530-TV on the cell-edge gate structure shared by the cells 510 and 530. The cell 550 includes three tie-off marker layer 550-TV1, 550-TV2, and 550-TV3 on different cell-edge gate structures shared by the cells 530, 540 and 560, respectively. The cell-edge gate structures of the cells 530 and 540 facing the cell 550 are aligned with each other and separated by gate partition layer (not separately shown), and therefore the cell 550 has separate tie-off marker layers 550-TV1 and 550-TV-2 corresponding to the separated cell-edge gate structures of the cells 530, 540.

Figure 5B:
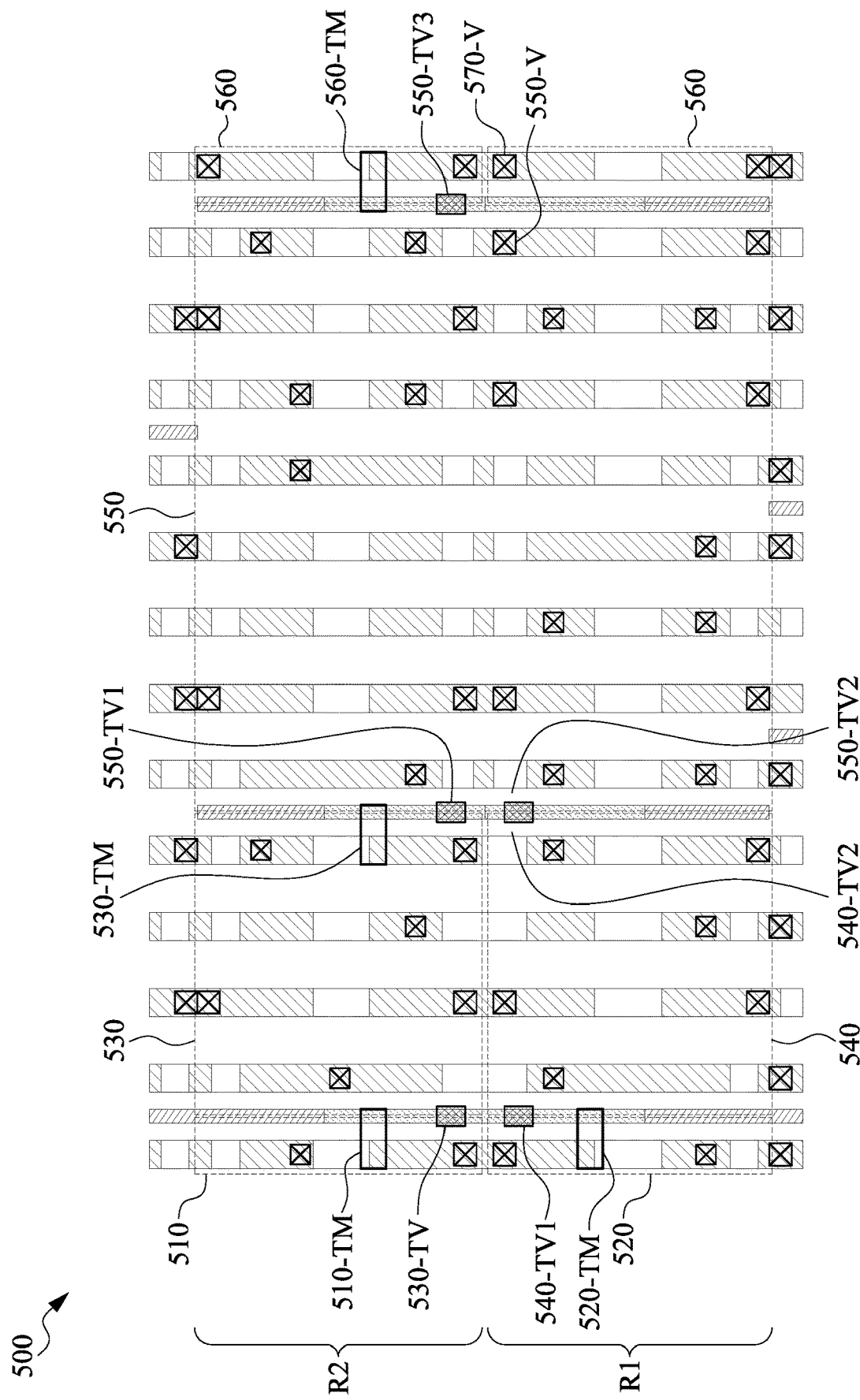

Referring to FIGS. 5A and 5B, a first post-processing step is performed to determine whether two adjacent tie-off conductive lines meet or join at their shared cell-edge gate structure. For example, both of the cells 550 and 570 include respective tie-off conductive lines 550-TM and 570-TM connected to the cell-edge gate structure shared by the cells 550 and 570. When the two tie-off conductive lines 550-TM and 570-TM are joined during the placement and routing operation and identified in the first post-processing step, that means the adjacent tracks TK on two sides of the cell-edge gate structure shared by the cells 560 and 580 are both source-end tracks TKS. In other words, the source/drain regions of the two source-end tracks TKS are connected to the first supply voltage VDD, and thus the interposed cell-edge gate structure will experience substantially zero voltage drop and will not induce to any leakage between the two source/drain regions biased at the first supply voltage VDD. The tie-off conduction path is thus provided by the conductive vias 550-V and 570-V in the respective source-end tracks TKS to electrically connect their underlying gate-layer conductive lines to the overlying power rail (not separately shown). As a result, the first post-processing step determines to remove both of the tie-off conductive lines 550-TM and 570-TM to simply the circuit design, as illustrated in FIG. 5B.

Figure 5C:
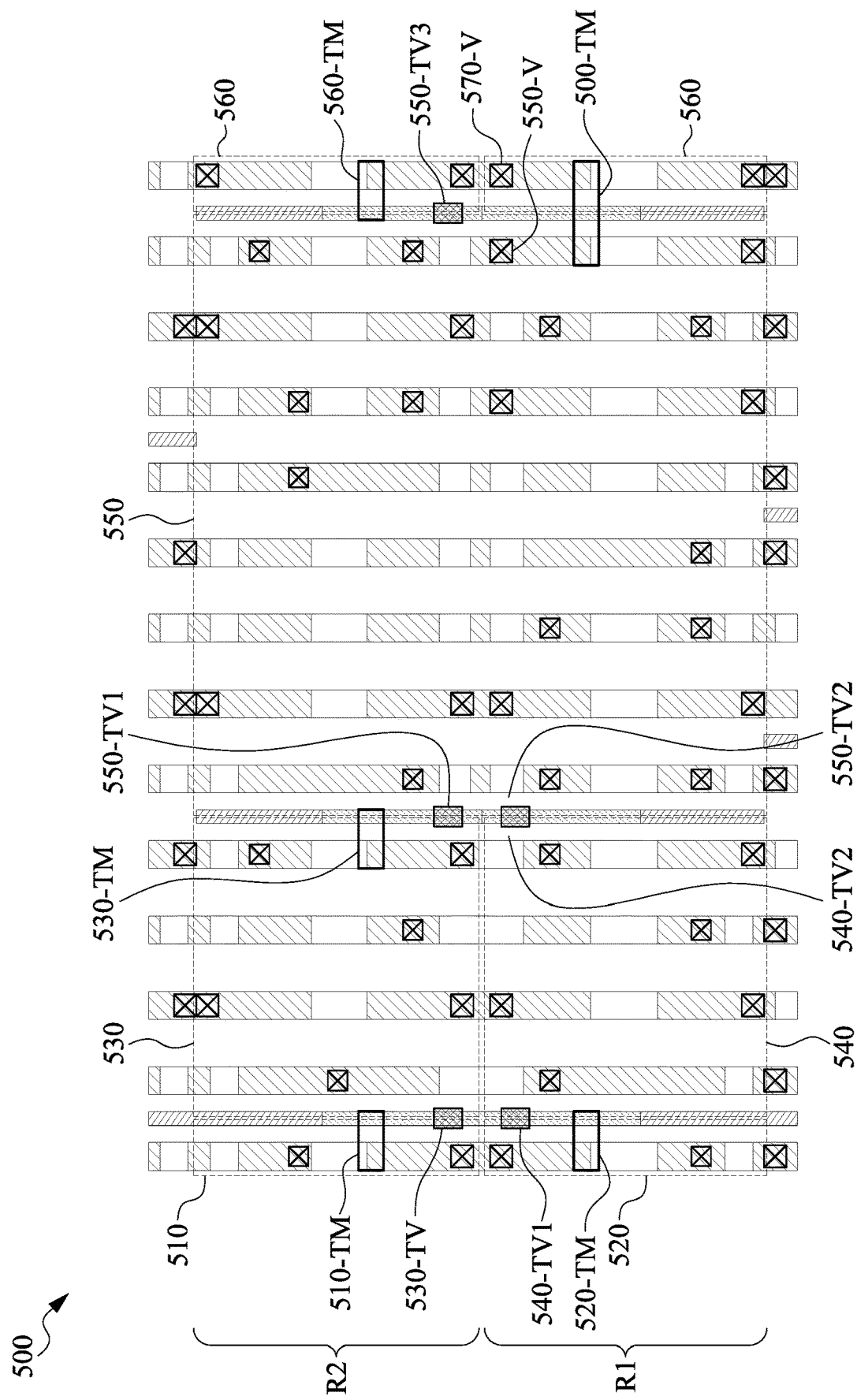

Referring to FIGS. 5A and 5C, an alternative approach is proposed for the first post-processing step regarding the joined tie-off conductive lines 550-TM and 570-TM. The conductive lines 550-TM and 570-TM are converted to a new conductive line 500-TM across the cell boundary between the cells 550 and 570. Compared to the tie-off conduction path provided in FIG. 5B, the conductive line 550-TM may be useful in providing more circuit design flexibility in formulating another tie-off conduction path to the cell-edge gate structure between the cells 550, 570.

Figure 5D:
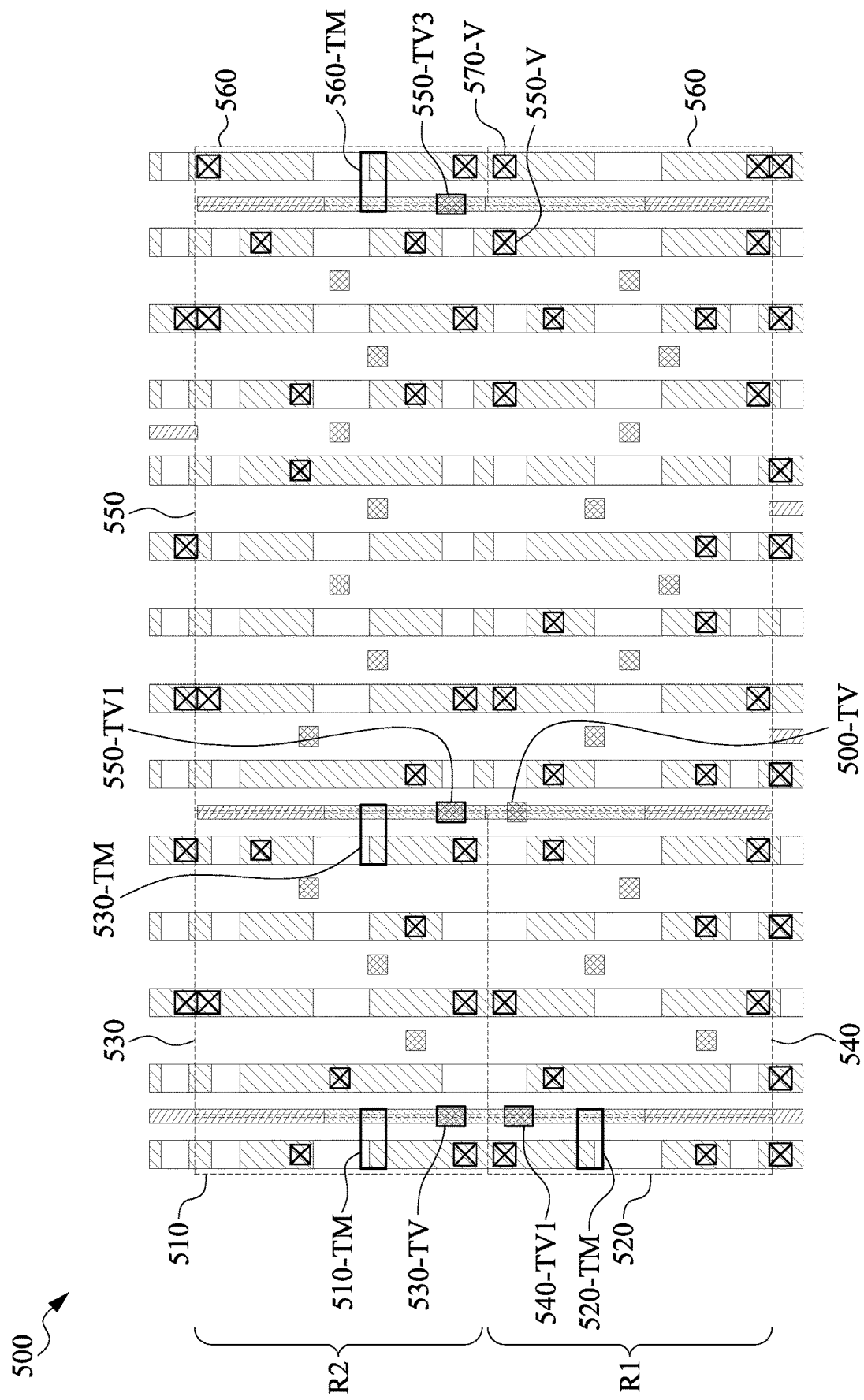

Referring to FIG. 5D, a second post-processing step is performed to determine whether two adjacent tie-off marker layers meet or join at their shared cell-edge gate structure. For example, both of the cells 540 and 550 includes respective tie-off marker layers 540-TV2 and 550-TV2 connected to the cell-edge gate structure shared by the cells 540 and 550. When the two joined tie-off marker layers 540-TV2 and 550-TV2 are identified, that means the adjacent tracks TK on two sides of the cell-edge gate structure shared by the cells 540 and 550 are both drain-end tracks TKD. The second post-processing step therefore determines to convert the marker layers 540-TV2 and 550-TV2 into a conductive via 500-TV in the conductive via layer L2 to tie off the cell-edge gate structure. The tie-off conduction path is thus provided by the conductive vias 500-TV to be electrically connected to its underlying cell-edge gate structure.

Figure 5E:
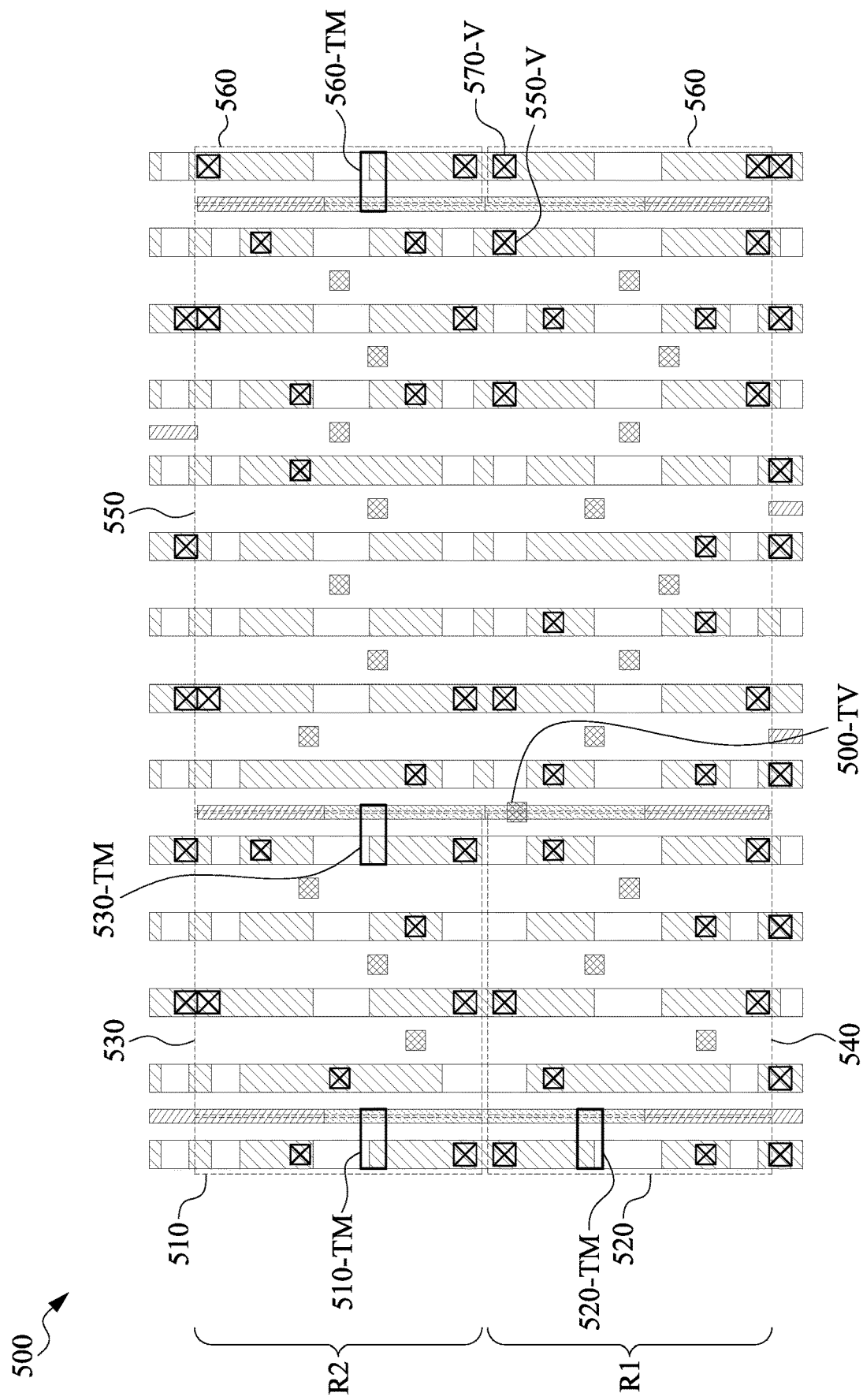

Referring to FIGS. 5D and 5E, a third post-processing step is performed to determine whether if there is any tie-off marker layer left alone on the respective cell-edge gate structure. For example, the tie-off marker layers 530-TV, 540-TV1, 550-TV1 and 550-TV3 are not paired with another tie-off marker layer of adjacent cells. That means the tie-off conduction paths for the cell-edge gate structure to which these standalone tie-off marker layers is connected have been formed by a tie-off conductive line provided by their adjacent cells. For example, the tie-off conduction path provided by the standalone tie-off marker layer 530-TV is replaced by that provided by the tie-off conductive line 510-TM of the cell 510. The third post-processing step therefore determines to remove all of the standalone tie-off marker layers to generate the processed design layout 500 after all of the joined tie-off marker layers or tie-off conductive lines have been identified and processed in the first and second post-processing steps, as illustrated in FIG. 5E.

In some embodiments, the first processing step described with reference to FIGS. 5B and 5C, the second processing step described with reference to FIG. 5D, and the third processing step described with reference to FIG. 5E can be performed at the same time or performed in a different order.

When the layout tool performs the design rule check and examines whether the design layout complies with the Requirements #1 through Requirements #4, the selection of a physical feature, e.g., the tie-off conductive line 218, or a logical feature, e.g., the tie-off marker layer 220, for a tie-off conductive line or conductive via can achieve the same purpose. In other words, the selection of the tie-off conductive line 218 can be alternatively replaced by an otherwise selected tie-off marker 218-1, or vice versa, and the layout tool is capable of performing the post-processing steps shown above for either one of the selections. Likewise, the selection of the tie-off marker layer 220 can be alternatively replaced by an otherwise selected tie-off conductive via 220-1, and the layout tool is capable of performing the post-processing steps shown above for either one of the selections.

Figure 6:
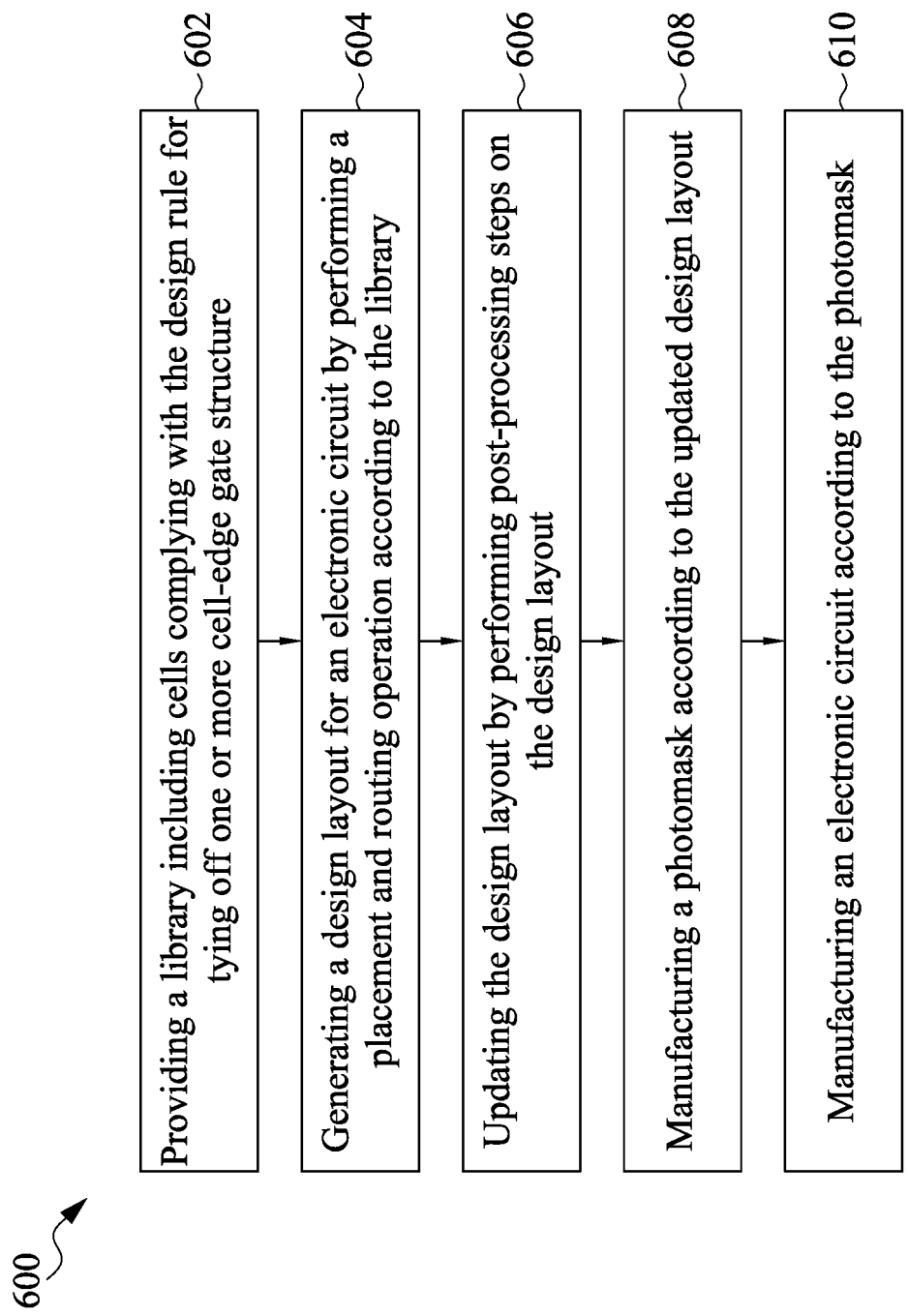
FIG. 6 is a flowchart of a method of manufacturing a semiconductor device, in accordance with some embodiments of the present disclosure.

FIG. 6 is a flowchart of a method 600 of manufacturing a semiconductor device, in accordance with some embodiments of the present disclosure. It should be understood that additional steps can be provided before, during, and after the steps shown in FIG. 6, and some of the steps described below can be replaced or eliminated in other embodiments of the method 600. The order of the steps may be interchangeable.

At step 602, a library is provided including cells, in which the cells comply with the design rules for tying off one or more cell-edge gate structure. For example, the Requirements #1 through Requirement #4 discussed previously with reference to FIG. 4 are exemplary design rules for designing the cells. In some embodiments, each of the cells include a two-portion cell-edge gate structures similar to the gate structure 132, 206 and 208.

At step 604, a design layout for an electronic circuit is generated by performing a placement and routing operation according to the library. The design layout may be generated according to design data associated with the electronic circuit. In some embodiments, the placement and routing operation includes placing cells in the design layout and abutting the cells in an appropriate manner such that the cells share cell-edge gate electrodes at their respective cell edges.

At step 606, the design layout is updated by performing post-processing steps on the design layout. For example, the first, second and third post-processing steps described with reference to FIGS. 5A through 5E are conducted to update the design data and the design layout.

At step 608, a photomask is generated according to the updated design layout. At step 610, an electronic circuit is generated according to the photomask.

Figure 7:
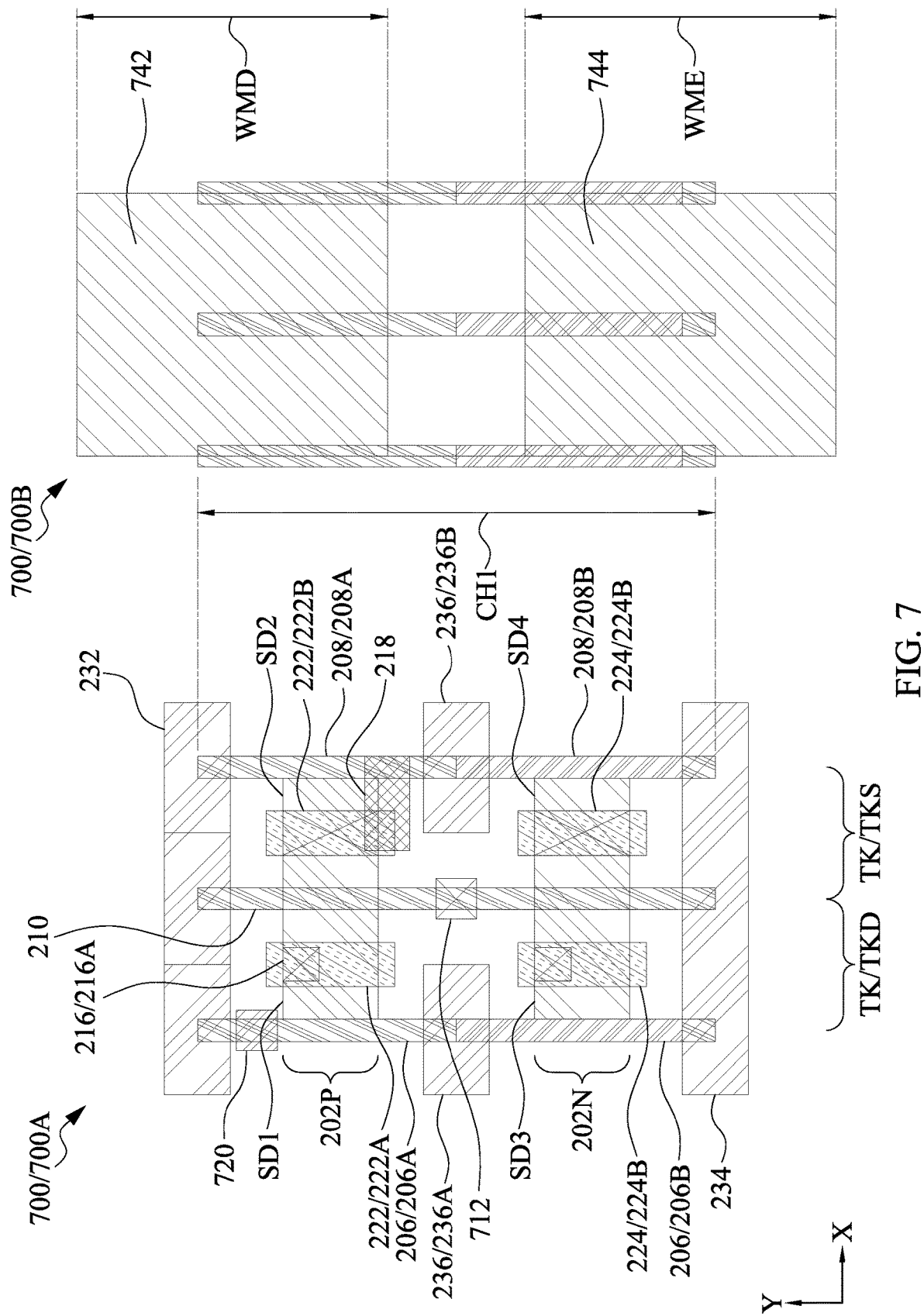
FIG. 7 shows design layouts of a cell, in accordance with some embodiments of the present disclosure.
Figure 8:
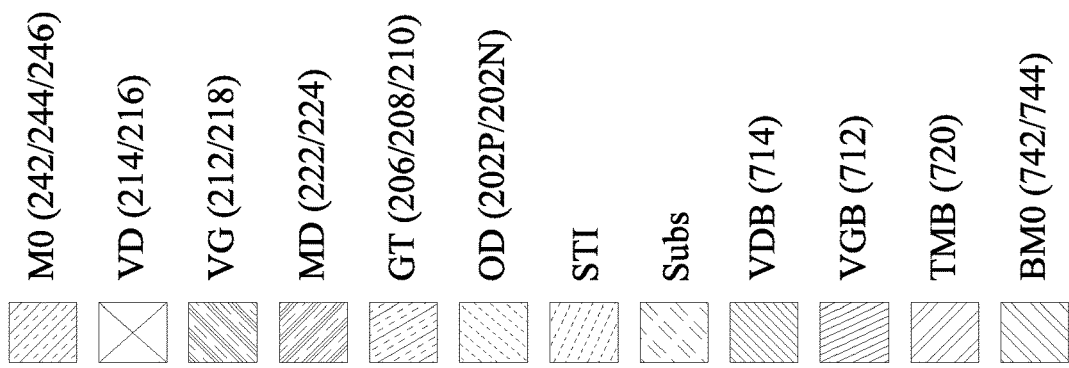
FIG. 8 is a cross-sectional view showing a vertical layer arrangement of a semiconductor device, in accordance with some embodiments of the present disclosure.
Figure 8:
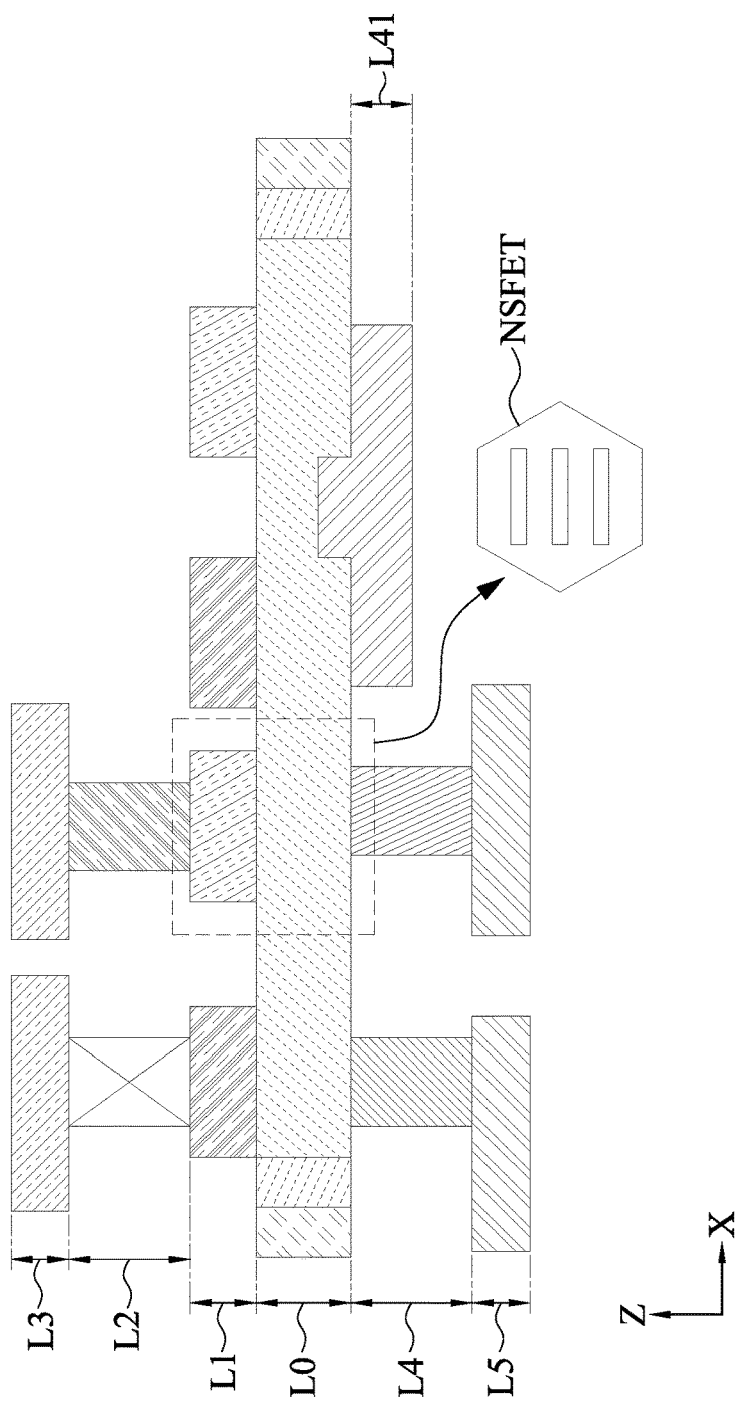

FIG. 7 shows design layouts 700A and 700B of a cell 700 in different layers, in accordance with some embodiments of the present disclosure. Referring to FIG. 7, multiple layers overlay one another along with various patterns in the respective layers as illustrated in the design layout 700A from a top-view perspective, while a power line layer alone is illustrated in the design layout 700B from a top-view perspective for clarity of illustration. FIG. 8 is a cross-sectional view 800A showing a vertical arrangement of the patterns in the respective layers of the cell 700, in accordance with some embodiments of the present disclosure.

The cell 700 is similar to the cell 200 in many aspects, and the similar features are not repeated herein for brevity. The cell 700 is different from the cell 200 in that the cell 700 further includes a backside PGN in addition to the frontside PGN, of which details are provided later in subsequent paragraphs. The frontside PNG and the backside PGN can be utilized alone or in combination to supply a power network to the cell 700.

Referring to FIG. 7, the substrate layer L0 is shown along with the active region OD and the isolation structures STI. In addition, the gate layer L1 with the gate structure GT is shown. The conductive via layer L2 and the conductive line layer L3 are also illustrated. The features of the layers L0 through L3 are similar to those described with reference to FIG. 3, and their details are not repeated for brevity. In some embodiments, for non-planar type FET, e.g., FinFET, GAA FET, nanosheet FET, nanowire FET, the active region OD may be formed of a plurality of fins, nanosheets or nanowires surrounded or wrapped by the gate structure GT from multiple directions, as illustrated by an exemplified cross section view of a nanosheet FET (NSFET) shown in FIG. 7. In that case, the compound gate structure/active region architecture may extend across the substrate layer L0 and the gate layer L1. Further, the gate electrode may wrap the plurality of nanosheets or nanowires, and thus in some embodiments the gate structures GT or the active region OD is exposed from the lower side of the substrate layer L0, as shown in FIG. 7. The exposed bottom sides of the gate structures GT or the active region OD may facilitate connection to the backside PGN.

Referring to FIG. 8 and the design layout 700A of FIG. 7, the cell 700 further includes the backside PGN formed of a backside conductive via layer L4 and a backside power line layer L5 on a bottom side of the substrate layer L0. The backside conductive via layer L4 may include a backside drain via (VDB) 714 electrically connected to the backside of the active region OD. The backside conductive via layer L4 may also include a backside gate via (VGB) 712 electrically connected to the backside of the gate structure GT or the active region OD. In some embodiments, the gate via 712 shown in the design layout 700A needs to adjust its locations in the Y-axis to overlap a backside power rail 742 in the backside power line layer L5 to thereby connect to the backside power rail 742 directly. However, the gate via 712 shown in FIG. 7 is for illustrative purposes, and a person of ordinary skill should appreciate the purpose of the backside gate via 714 and make any modifications where appropriate.

The backside power line layer L5 includes backside power rails (BM0) 742 and 744 extending in the row direction. The backside power rails 742 and 744 are arranged on an upper cell side and a lower cell side, respectively, of the cell 700. In some embodiments, the backside power rails 742 and 744 are configured to supply the first supply voltage VDD and the second supply voltage VSS, respectively. In contrast, the power rails 242, 244 can be referred to herein as the frontside power rails. The backside power rail 742 has a width WMD measured in the column direction, and the backside power rail 744 has a width WME measured in the column direction. In some embodiments, the width WMD is substantially equal to or greater than the width WME. In some embodiments, the area of the backside power line layer L5 is allocated to the backside power rails 742 and 744 only without other signal-type conductive lines, and the widths WMD and WME may be greater than their counterpart widths WMA and WMB of the power rails 242 and 244 in the conductive line layer L3.

Referring to FIG. 7, the backside conductive via layer L4 may further include a backside tie-off conductive line (TMB) 718 arranged in a sublayer L41 of the backside conductive via layer L4. The backside tie-off conductive line 718 serves the function of tying off the dummy gate structure 206B or 208B in a manner similar to the (frontside) tie-off conductive line 218. However, different from the tie-off conductive line 218 which is arranged on the front side of the cell 700, the backside tie-off conductive line 718 supports the tie-off conduction path from the backside of the cell 700. In some embodiments, the backside tie-off conductive line 718 extends to the substrate layer L0 to electrically connect the gate structure GT and the gate-layer conductive line MD. The conduction path formed by the backside tie-off conductive line 718 is described in greater detail with reference to FIGS. 10A to 10C.

The design layout 700A includes a backside marker layer 720 over the gate structure 206A, Similar to the tie-off marker layer 220, the backside tie-off marker layer 720 may be converted into a corresponding conductive via through a post-processing step to tie off the dummy gate structure 206A or 208A, The backside tie-off marker layer 720 is different from the (frontside) tie-off marker layer 220 in that the tie-off conductive via converted from the backside tie-off marker layer 720 supports the conduction path from the backside of the cell 700. Through the backside tie-off structure described herein, the backside tie-off conductive line 718 and the backside tie-off marker layer 720 provide advantages of better design flexibility for tie-off conduction paths and further device are reduction.

The design rules of the backside tie-off conductive line 718 and the backside tie-off marker layer 720 are similar to those of the tie-off conductive line 218 and backside the tie-off marker layer 720 and are excerpted below.

[Requirement #5]: Referring to the label (1) in FIG. 4 and FIG. 7, when a cell-edge gate structure, e.g., gate structure 108A, is immediately adjacent to a drain-end track TKD, an instance of the backside tie-off marker layer 720 is generated on the cell-edge gate structure 106A to overlap the backside power rail 742.

[Requirement #6]: Referring to the label (2) in FIG. 4 and FIG. 7, when a cell-edge gate structure, e.g., gate structure 106A, is immediately adjacent to a source-end track TKS, an instance of the backside tie-off conductive line 718 is formed to electrically connect the cell-edge gate structure 106A to the power rail 442 or 742 through the gate-layer conductive line in the lower portion of the gate layer L1 and the backside gate-layer conductive via 714A.

In some embodiments, Requirements #3 and #4 are not required for the backside PCN since there would be no conductive lines, like the conductive lines 246 in the conductive line layer L3, present in the backside power line layer L5.

FIGS. 9A-9I are cross-sectional views 900A and 900B and design layouts 900C of intermediate stages of manufacturing a semiconductor device 900, in accordance with some embodiments of the present disclosure. The semiconductor device 900 may include an electronic device, such as one or more of a NAND gate device, an inverter gate, an XOR gate, an AND gate, a NOR gate, an AOI gate, or other suitable logic gate devices. In some embodiments, the semiconductor device 900 is a FinFET, a GAA FET, e.g., a nanosheet FET or a nanowire FET.

The cross-sectional views 900A and 900B are drawn along sectional lines AA' and BB', respectively, of the design layout 900C, where the cross-section view 900A illustrates features around a source/drain region within a track TK while the cross-section view 900A illustrates features around the cell-edge gate structure. The design layout 900C of the semiconductor device 900 can be seen as an overlaid design layout incorporating the backside conductive via layer L4 and the backside power rail layer L5. FIGS. 9A-9I are illustrated to show the formation of a backside tie-off conductive via from the backside of the semiconductor device 900. As such, some aspects of manufacturing the semiconductor device 900 may be simplified or omitted for the sake of clarity.

Figure 9A:
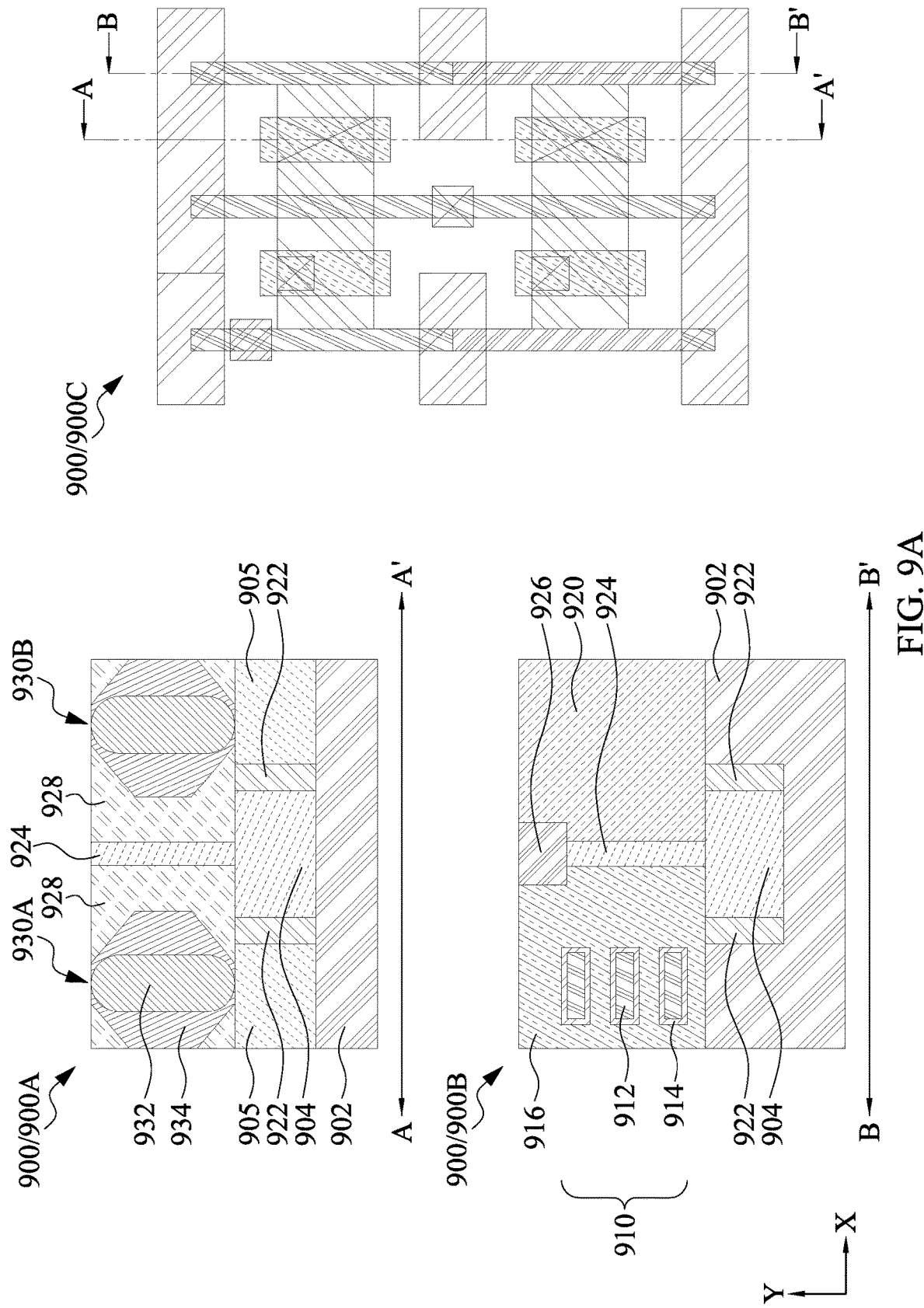
FIGS. 9A-9I are cross-sectional views and layouts of intermediate stages of manufacturing a semiconductor device, in accordance with some embodiments of the present disclosure.

Referring to FIG. 9A, all or part of the features on the front side of the semiconductor device 900 have been formed. The semiconductor device 900 includes a substrate 902. In some embodiments, the substrate 902 includes bulk silicon or other semiconductor materials, such as germanium. An isolation region 904 and spacer layers 922 are formed over the substrate 902, in which the isolation region 904 and the spacer layers 922 correspond to the backside conductive via layer L4 of FIG. 7. The isolation region 904 and the spacer layer 922 are formed of dielectric materials, e.g., silicon nitride, silicon oxide, silicon carbide, silicon oxynitride, high-k dielectric materials, of the like. In some embodiments, the isolation region 904 and the spacer layer 922 are formed of different dielectric materials or materials with a high etching selectivity.

Referring to the cross-sectional view 900A, one or more sacrificial layer 905 is formed over the substrate 902. In some embodiments, the sacrificial layer 905 is formed of a semiconductor material, e.g., silicon germanium, which has a high etching selectivity with respect to an etchant against the substrate 902. A first partition layer 924 and a second partition layer 926 are formed over the isolation region 904 at the boundary between a P-FET region and an N-FET region. The first partition layer 924 may extend across the semiconductor device 900 in the horizontal direction between the P-FET region and the N-FET region, while the second partition layer 926 is arranged over the corresponding gate structure, e.g., gate structure 206 or 208. The partition layer 924 or 926 may correspond to the gate partition pattern 236 shown in FIG. 2. In some embodiments, the first partition layer 924 and a second partition layer 926 are formed of dielectric materials, e.g., silicon nitride, silicon oxide, silicon carbide, silicon oxynitride, high-k dielectric materials, of the like. In some embodiments, the first partition layer 924 and a second partition layer 926 are formed of different dielectric materials.

Referring to the cross-section view 900A, two epitaxial regions 930A and 930B are formed over the sacrificial layers 905 on two sides of the partition layers 924, 926. In some embodiments, the epitaxial region 930A is formed in the P-FET region and include a P-type impurity, and the epitaxial region 930B is formed in the N-FET region and include an N-type impurity. The epitaxial regions 930A and 930B serve as source/drain regions of the P-FET and N-FET, respectively, of the semiconductor device 900. In some embodiments, the epitaxial region 930A or 930B is formed of epitaxially grown materials and include a multilayer structure, e.g., formed of a first epitaxial layer 932 and a second epitaxial layer 934. The first epitaxial layer 932 and a second epitaxial layer 934 may differ in doping concentration, e.g., the first epitaxial layer 932 has a doping concentration than that of the second epitaxial layer 934, to improve the performance of the epitaxial regions 930A, 930B.

In some embodiments, the semiconductor device 900 further includes a dielectric layer 928 serving as the isolation structure STI to electrically insulate the epitaxial regions 930A and 930B from adjacent conductive features. The dielectric layer 928 may include silicon oxide, silicon nitride, silicon carbide, silicon oxynitride, high-k dielectric materials, or the like. In some embodiments, the dielectric layer 928 include a material the same as or different from the first partition layer 924 or the second partition layer 926.

Referring to the cross-section view 900B, a first gate structure 910 and a second gate structure 920 are formed over the over the substrate 902 on two sides of the first partition layer 924. In some embodiments, the first gate structure 910 is a functional gate structure, and the second gate structure 920 is a dummy or non-functional gate structure. In some embodiments, the epitaxial region 930A corresponds to a source/drain region (e.g., the source/drain region SD1 and SD2 shown in FIG. 2 and FIG. 7) of the P-FET of the semiconductor device 900 with the first gate structure 910 serving as the cell-edge gate structure (e.g., the gate structure 206A/208A shown in FIG. 2 and FIG. 7). In some embodiments, the epitaxial region 930B correspond to a source/drain region (e.g., the source/drain region SD3 and SD4 shown in FIG. 2 and FIG. 7) of an N-FET of the semiconductor device 900 with the first gate structure 910 serving as the cell-edge gate structure (e.g., the gate structure 206B/208B shown in FIG. 2 and FIG. 7).

The first gate structure 910 includes a plurality of channel regions 912, a plurality of gate dielectric layers 914 and a gate electrode layer 916. The channel regions 912 may be arranged extending in parallel in the horizontal direction, e.g., the X-axis, and may be referred to as nanosheets. In some embodiments, the channel region 912 is formed of a semiconductor material, such as silicon. The gate dielectric layers 914 wrap the respective channel regions 912 and may include one or more of high-k dielectric materials. In some embodiments, the gate electrode layer 916 wrap around the channel regions 912 and gate dielectric layers 914. The gate electrode layer 916 may include one or more layers, such as a diffusion barrier layer, a capping layer, a work function adjustment layer, and a filling conductive layer, or the like, and include conductive materials, e.g., Ti, Ta, Ru, Co, Al, Ag, Au, W, Ni, Cu, Mn, Pd, Re, Ir, Pt, Zr, alloys thereof, combinations thereof. In some embodiments, the first gate structure 910 is configured as a CNOD gate structure, e.g., the gate structure 206A, 208A.

The second gate structure 920 is formed of a dielectric material, e.g., silicon oxide, silicon nitride, silicon carbide, silicon oxynitride, high-k dielectric materials, or the like. In some embodiments, the first gate structure 920 is configured as a CPODE gate structure, e.g., the gate structure 206B, 208B.

The deposition of the abovementioned layers may be performed by physical vapor deposition (PVD), chemical vapor deposition (CVD), atomic layer deposition (ALD), high-density plasma chemical vapor deposition (HDP-CVD), flowable CVD (FCVD), a combination thereof, or the like.

Figure 9B:
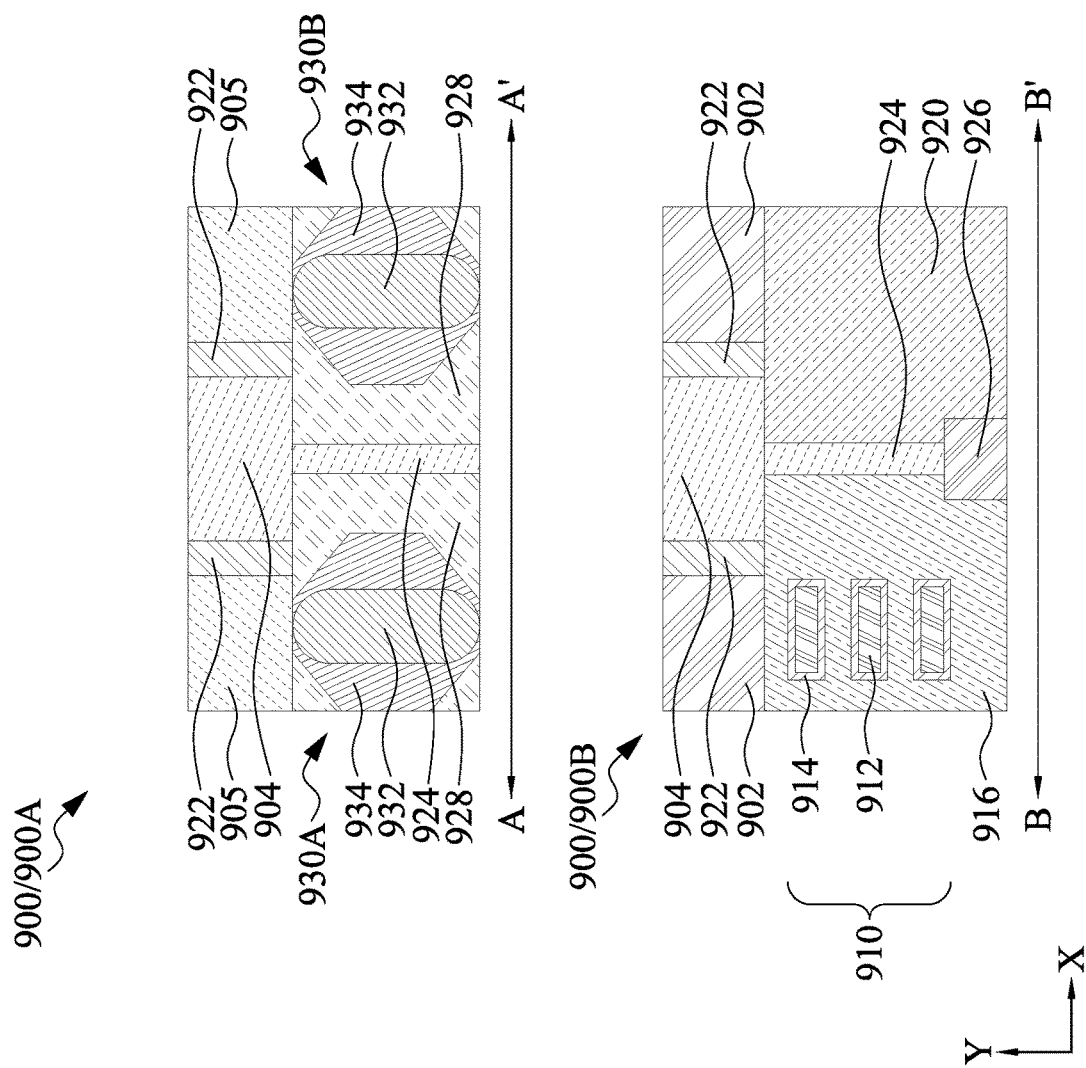

Referring to FIG. 9B, the semiconductor device 900 is flipped to expose the bottom side of the substrate 902. A thinning operation is performed to thin or remove a thickness of the substrate 902. As a result, the isolation region 904, the spacer layers 922 and the sacrificial layers 905 are exposed through the thinning operation. In some embodiments, the thinning operation is performed using chemical mechanical polishing (CMP), mechanical grinding, laser etching, or the like.

Figure 9C:
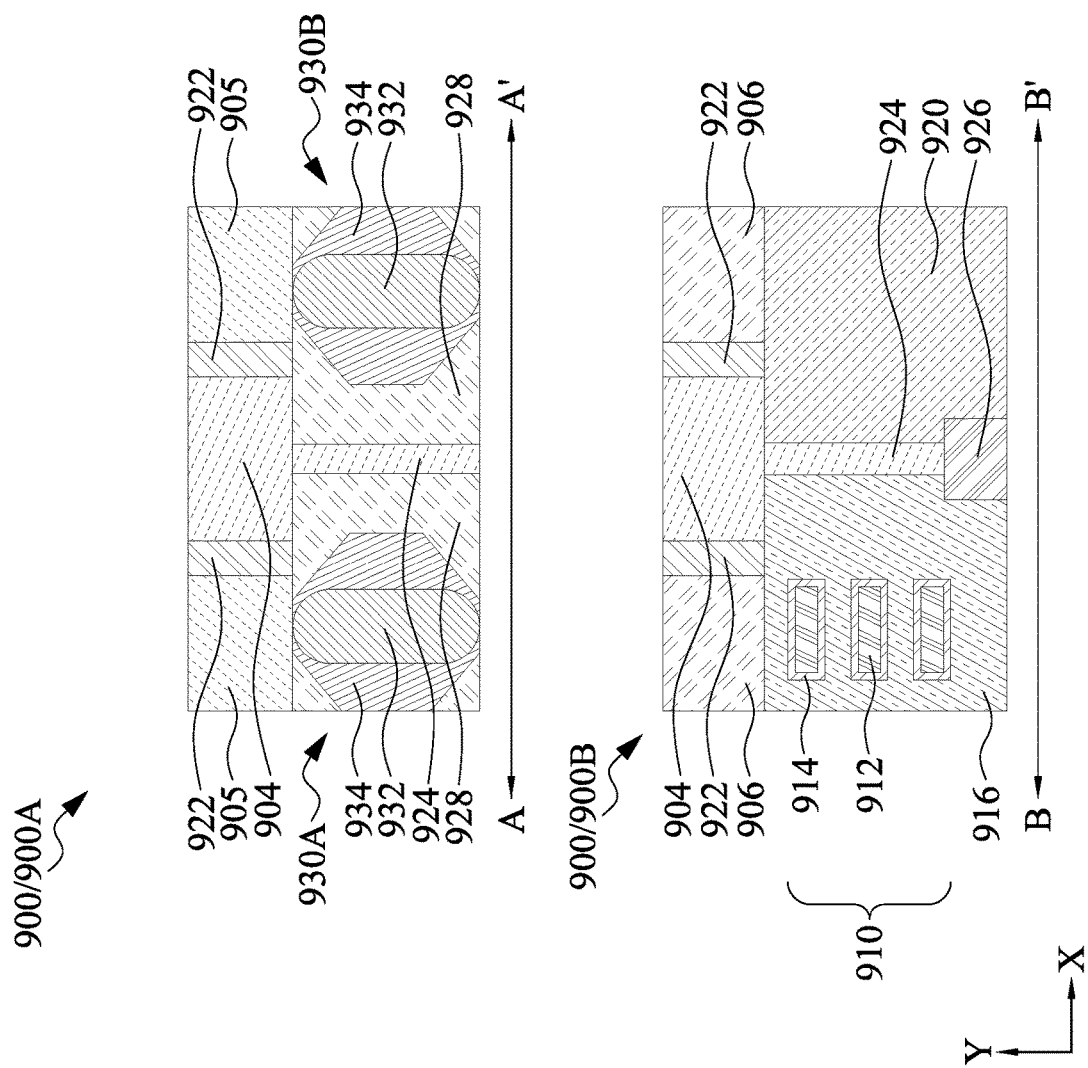

Referring to FIG. 9C, referring to the cross-sectional view 900B, portions of the substrate 902 are removed or etched. The removal of the substrate 902 may be performed using a dry etch, a wet etch, a combination thereof, e.g., reactive ion etch (RIE), or the like. The space of the removed portions of the substrate 902 is filled with isolation regions 906 to define a pattern for the subsequently formed tie-off conductive via 946. The isolation regions 906 may include insulating materials, such as a dielectric material, e.g., silicon oxide, silicon nitride, silicon oxynitride, a combination thereof, or the like. The isolation regions 906 may be formed by PVD, CVD, ALD, a combination thereof, or the like. In some embodiments, a planarization operation, e.g., CMP, may be employed to level the surface of the isolation regions 906 with the isolation region 904 and the spacer layers 922.

Figure 9D:
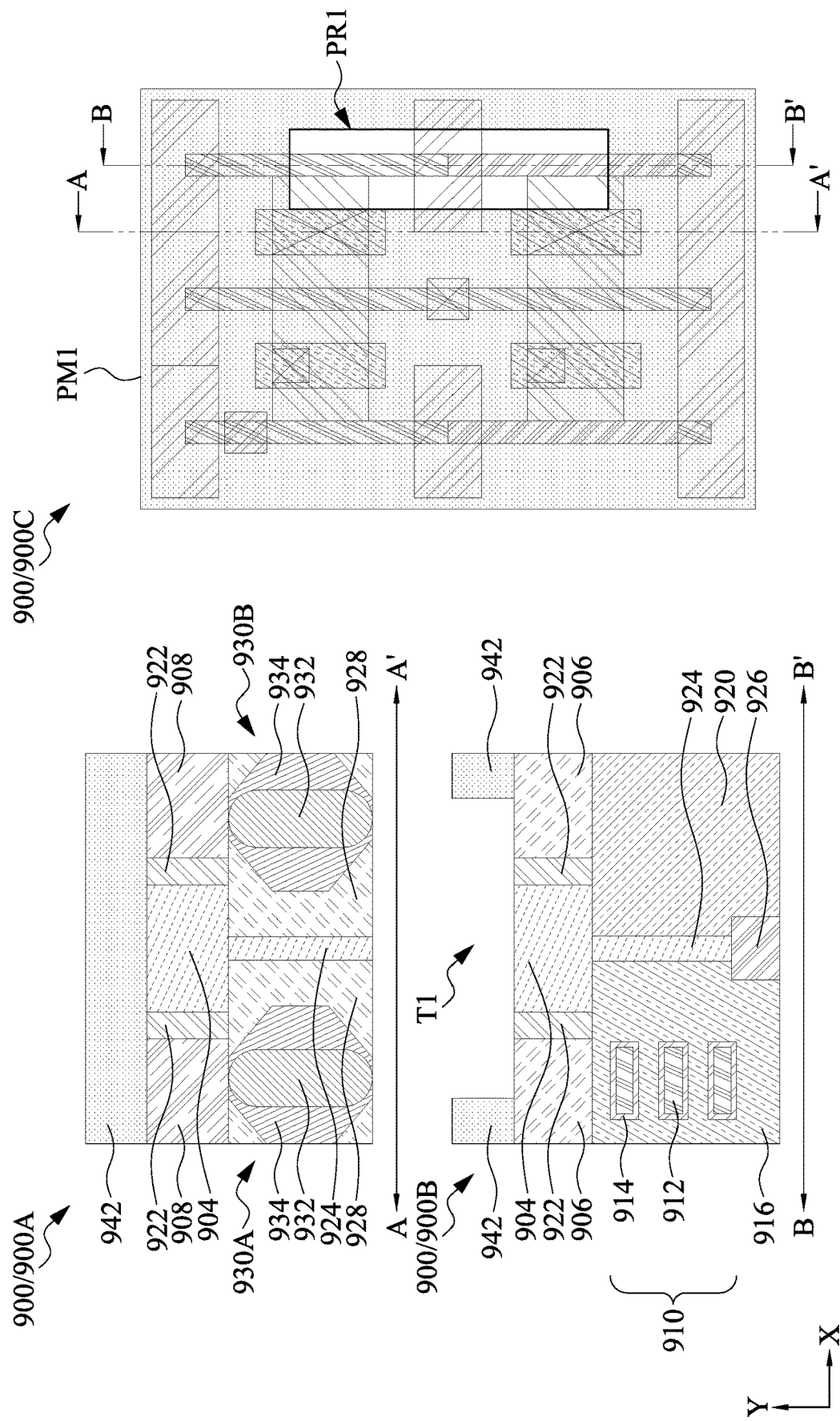

Referring to FIG. 9D, referring to the cross-sectional view 900A, the sacrificial layers 905 are removed or etched. The removal of the sacrificial layers 905 may be performed using a dry etch, a wet etch, an RIE, or the like. The spaces of the removed sacrificial layers 905 are filled with backside conductive vias 908. The backside conductive vias 908 may include conductive materials, such as tungsten, aluminum, titanium, tantalum, gold, silver, copper, alloys thereof, a combination thereof, or the like. The backside conductive vias 908 may be formed by PVD, CVD, ALD, or the like. In some embodiments, a planarization operation, e.g., CMP, may be employed to level the surface of the backside conductive vias 908 with the isolation region 904 and the spacer layers 922.

In some embodiments, backside conductive lines (not shown, but can be referred to as the gate-layer conductive lines MD in the gate layer L1 below the substrate layer L0 shown in FIG. 8) are formed on the epitaxial regions 930A, 930B before the deposition of the backside conductive vias 908. Therefore, the epitaxial regions 930A, 930B can be electrically connected to a backside PGN through the backside conductive lines in addition to the backside conductive vias 805.

Subsequently, referring to the cross-sectional view 900B, a mask layer 942 is formed over the semiconductor device 900 and patterned to form an opening T1. In some embodiments, the mask layer 942 is a hard mask, e.g., formed of silicon nitride, or a photoresist layer. Referring to the design layout 900C, a photomask PM1 is used to pattern the mask layer 942, in which the photomask PM1 includes a pattern PR1 exposing an area around the boundary between the first gate structure 910 and the second gate structure 920. A patterning operation is performed on the mask layer 942 by etching the mask layer 942 with the photomask PM1 as the etching mask. As a result, the pattern PR1 is transferred to the opening T1 in the patterned mask layer 942, and the isolation region 904 and the spacer layers 922, and portions of the epitaxial regions 930A, 930B and the isolation regions 906 are exposed. The patterning of the mask layer 942 may include photolithography and etching operations. The etching operation may be performed using a dry etch, a wet etch, an RIE, or the like.

Figure 9E:
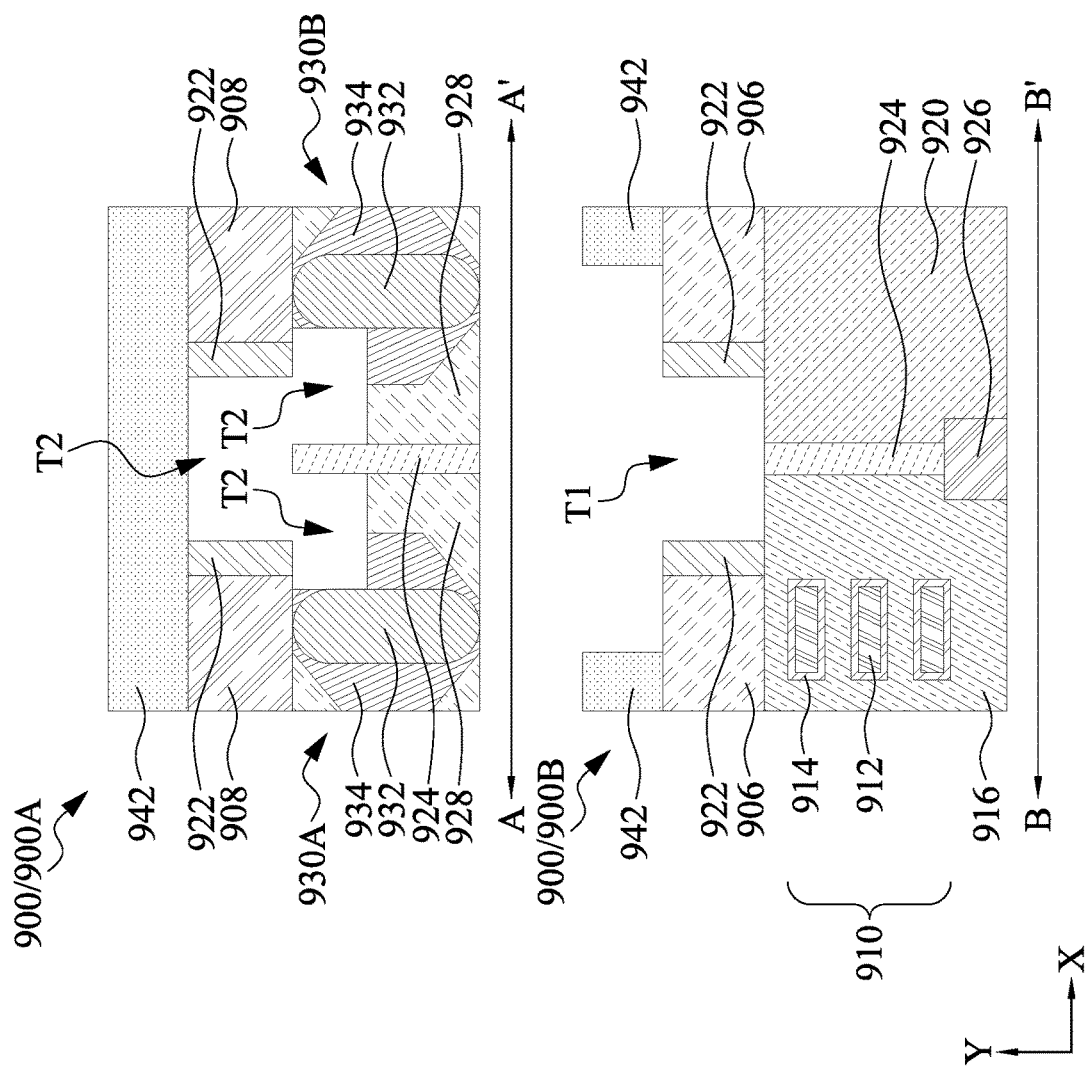

FIG. 9E illustrates an etching operation to remove the isolation region 904 and the spacer layers 922 that are exposed through the opening T1. In some embodiments, the etching operation is performed by a dry etch, a wet etch, an RIE, or the like. The etching operation etches portions of the isolation region 904 that are exposed through the opening T1 and stops on the first partition layer 924 and the spacer layers 922. As a result, the opening T1 extends downward to form a trench T2, defined by the spacer layers 922 and exposing the first gate structure 910 and the second gate structure 920.

Referring to the cross-section views 900A in FIGS. 9D and 9E, the etching operation proceeds to portions of the active region 202P (see FIG. 7) that are adjacent to the gate structures 910 and 920 and covered by the photomask PM1. The etching operation consumes portions of the isolation region 904, the dielectric layers 928 and the epitaxial regions 930A, 930B under the isolation region 904 and the backside conductive vias 908. Although the consumed portions of the dielectric layers 928 and the epitaxial regions 930A, 930B are covered by the patterned mask layer 942, the etching starts from the exposed portions of the dielectric layers 928 and the epitaxial regions 930A, 930B overlapped with the pattern PR1. Referring to the cross-sectional view 900A, the etching runs in downward and lateral directions layer to extend the trench T2 to locations that are covered by the patterned mask layer 942 as denoted by the label T2. In some embodiments, the trench T2 consumes a corner of each of the epitaxial regions 930A, 930B. In some embodiments, the etching operation includes an etchant selective to the material of the isolation region 904 with respect to the materials of the isolation region 906, the spacer layers 922, the backside conductive via 908 and the first partition layer 924 so that these regions apart from the isolation region 904 are kept unetched during the etching operation.

Figure 9F:
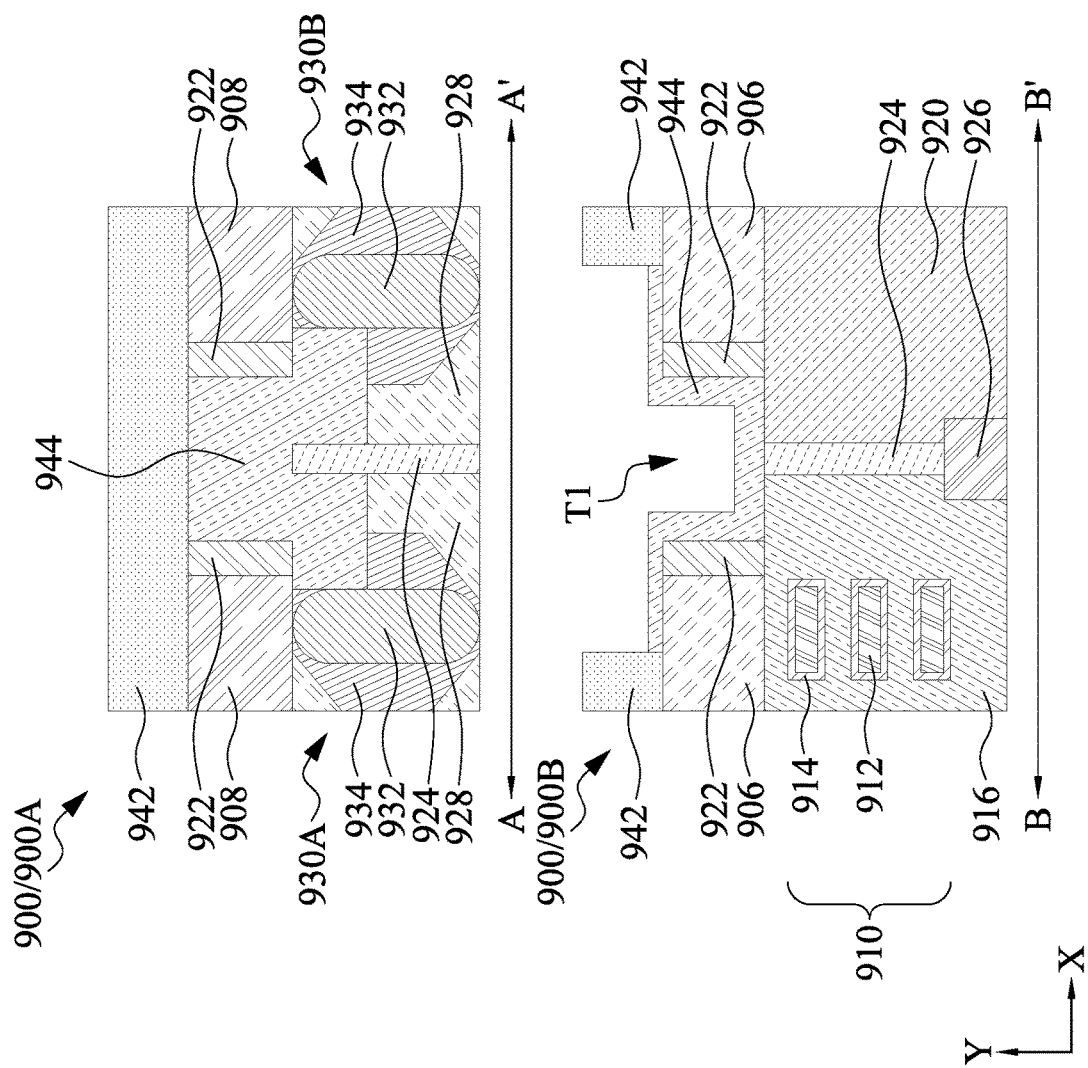

FIG. 9F shows a deposition operation of a protection layer 944 on sidewalls and the bottom surface of the trench T2. In some embodiments, the protection layer 944 includes a substantially uniform thickness on the surfaces of the surfaces of the gate structures 910, 920 and the first partition layer 924, the sidewalls and the upper surface of the spacer layers 922 and the upper surface of the isolation region 906, and the exposed sidewalls of the epitaxial regions 930A, 930B. The protection layer 944 may be formed of a dielectric material, e.g., silicon oxide, silicon nitride, silicon carbide, silicon oxynitride, or the like, using CVD, PVD, ALD, or the like.

Figure 9G:
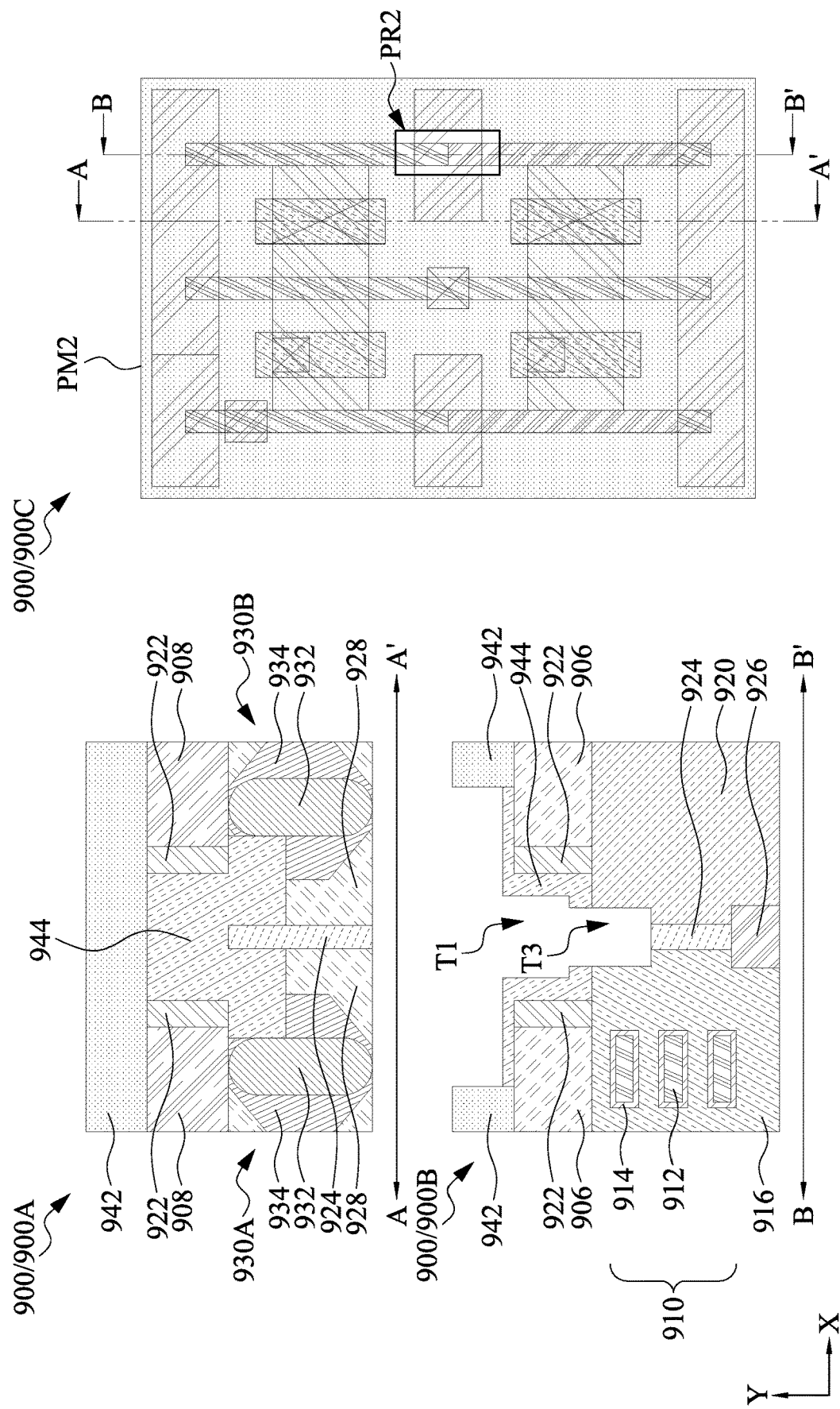

Referring to FIG. 9G, an etching operation is performed to extend the trench T2 downward to form a trench T3 in the first gate structure 910. In some embodiments, the formation of the trench T3 also removes portions of the first partition layer 924 and the second gate structure 920. Referring to the design layout 900C, a photomask PM2 is used to form the trench T3, in which the photomask PM2 includes a pattern PR2 exposing an area around the boundary between the first gate structure 910 and the second gate structure 920. The pattern PR2 may have a length measured in the column direction less than the length of the pattern PR1. A patterning operation is performed by etching through the protection layer 944 at the bottom of the trench T2 and removing a depth of the gate structures 910, 920 and the first partition layer 924 with the photomask PM2 as the etching mask. The etching operation keeps the protection layer 944 on the side-walls of the epitaxial regions 930A, 930B substantially intact for electrically insulating the epitaxial regions 930A, 930B from the subsequently formed tie-off conductive via 946 in the trenches T2 and T3. In some embodiments, the trench T3 is formed only within the first gate structure 910. In some embodiments, the trench T3 stops within the gate electrode layer 916 without etching the gate dielectric layer 914 and the channel regions 912. The etching operation may be performed using a dry etch, a wet etch, an RIE, or the like.

Figure 9H:
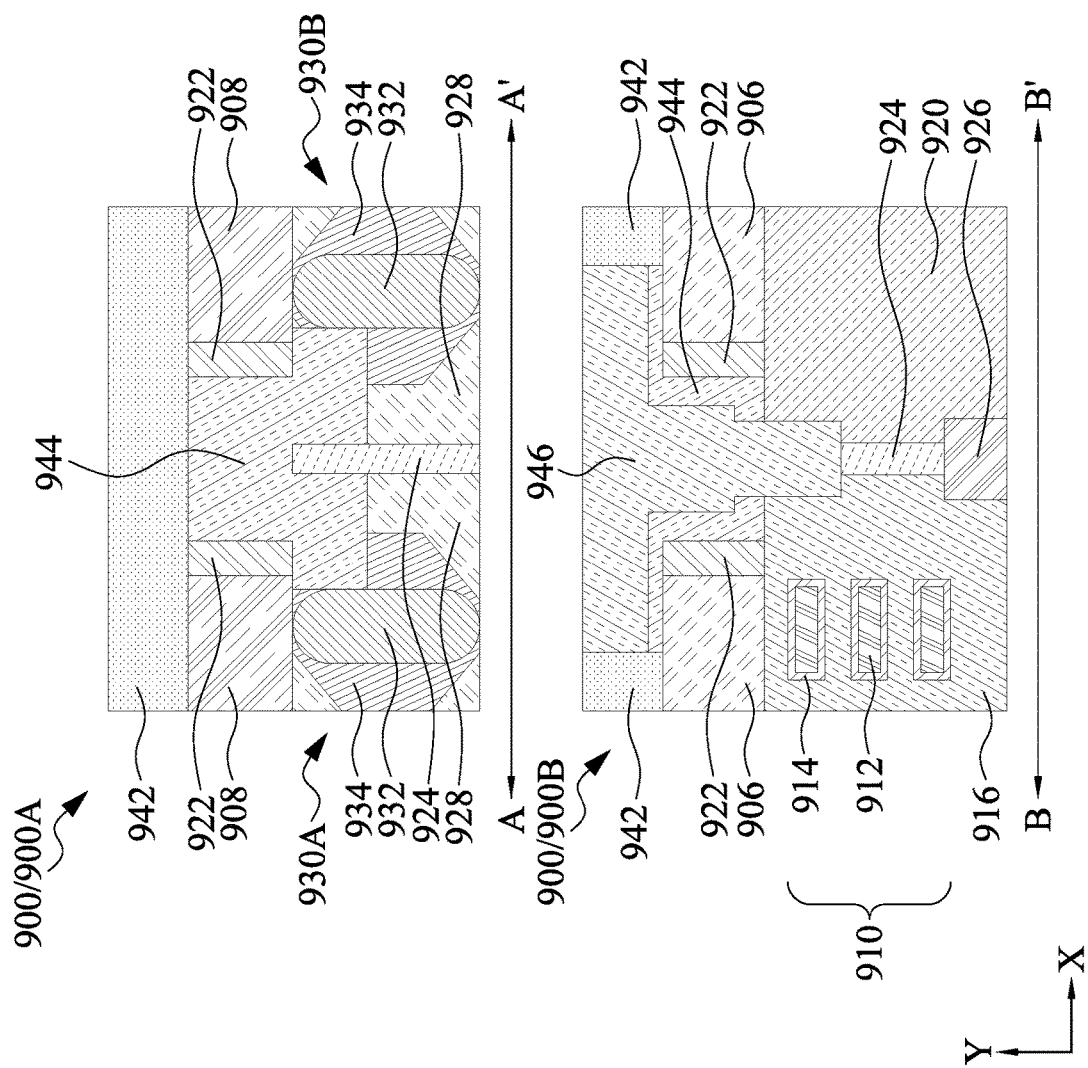

FIG. 9H illustrates the formation of the tie-off conductive via 946 in the opening T1 and the trenches T2 and T3. The tie-off conductive via 946 may be formed of a conductive material, e.g., tungsten, aluminum, titanium, tantalum, gold, silver, copper, alloys thereof, a combination thereof, or the like. The tie-off conductive via 946 may be formed by PVD, CVD, ALD, or the like.

Figure 9I:
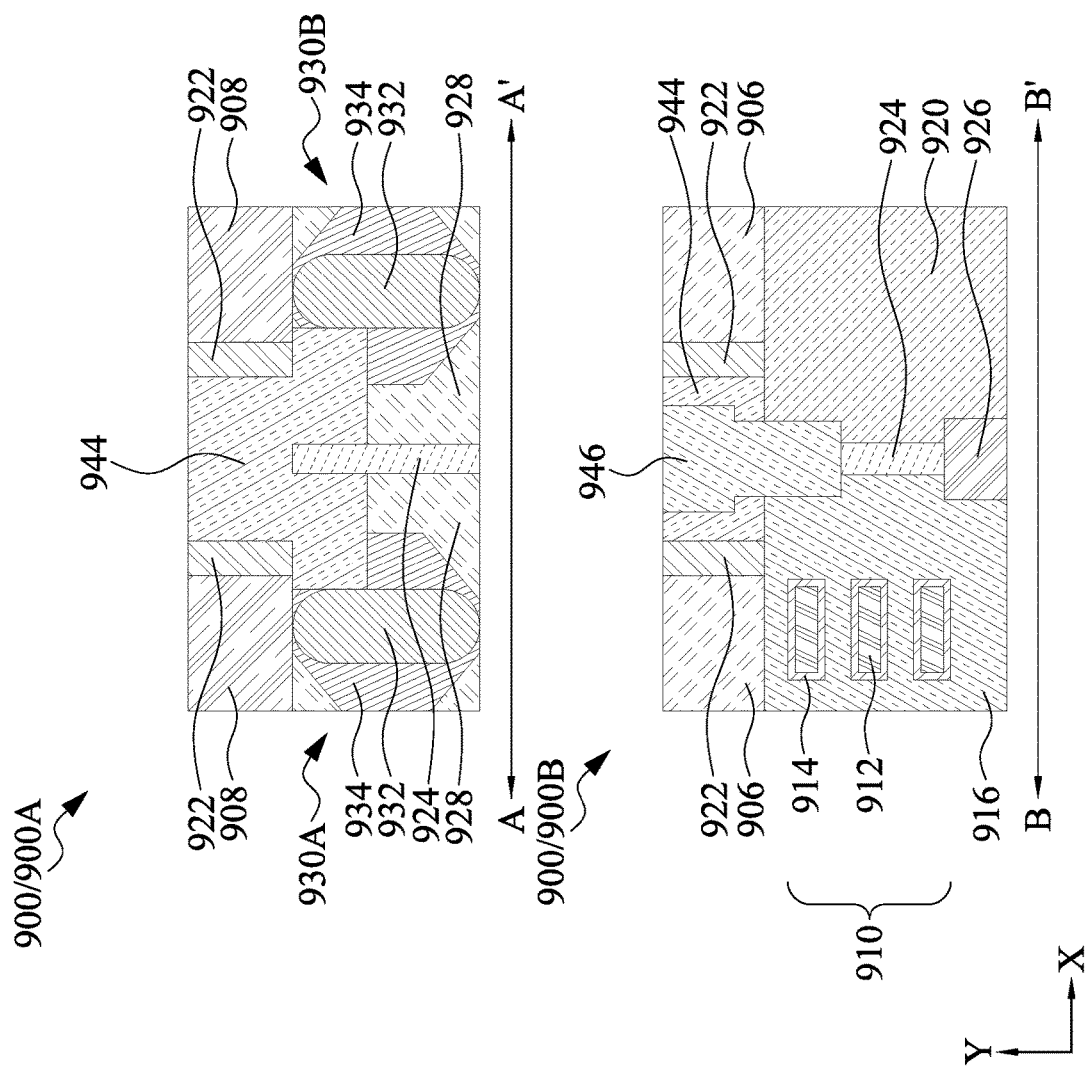

Referring to FIG. 9I, a planarization operation is performed to remove the mask layer 942 and upper portions of the tie-off conductive via 946 to expose the isolation region 906. The planarization operation may also level the upper surface of the tie-off conductive via 946 with the protection layer 944 and the isolation region 906.

In some embodiments, although not explicitly shown, the semiconductor device 900 includes a backside power rail (e.g., the backside power rail 742 shown in FIG. 7) over the tie-off conductive via 946 (e.g., the backside tie-off marker layer 720 shown in FIG. 7). The locations of the backside power rail and the tie-off conductive via 946 may be adjusted in the column direction such that they overlap each other from the top-view perspective. As a result, the tie-off conductive via 946 can be connected to the overlying backside power rail, biased at the first supply voltage provided by the backside power rail, and tie off the first gate structure 910 accordingly.

Figure 10A:
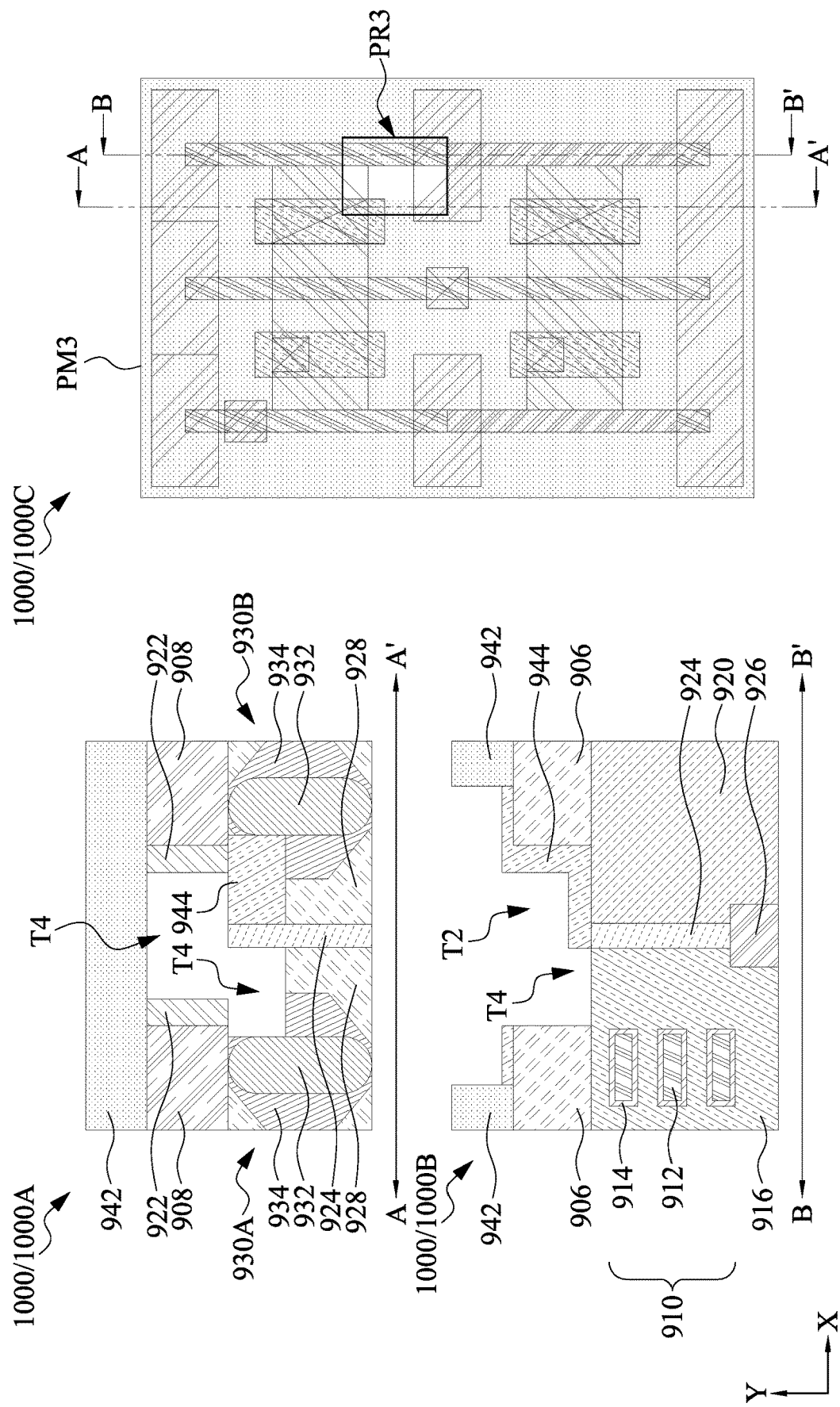
FIGS. 10A-10C are cross-sectional views and layouts of intermediate stages of manufacturing a semiconductor device, in accordance with some embodiments of the present disclosure.
Figure 10B:
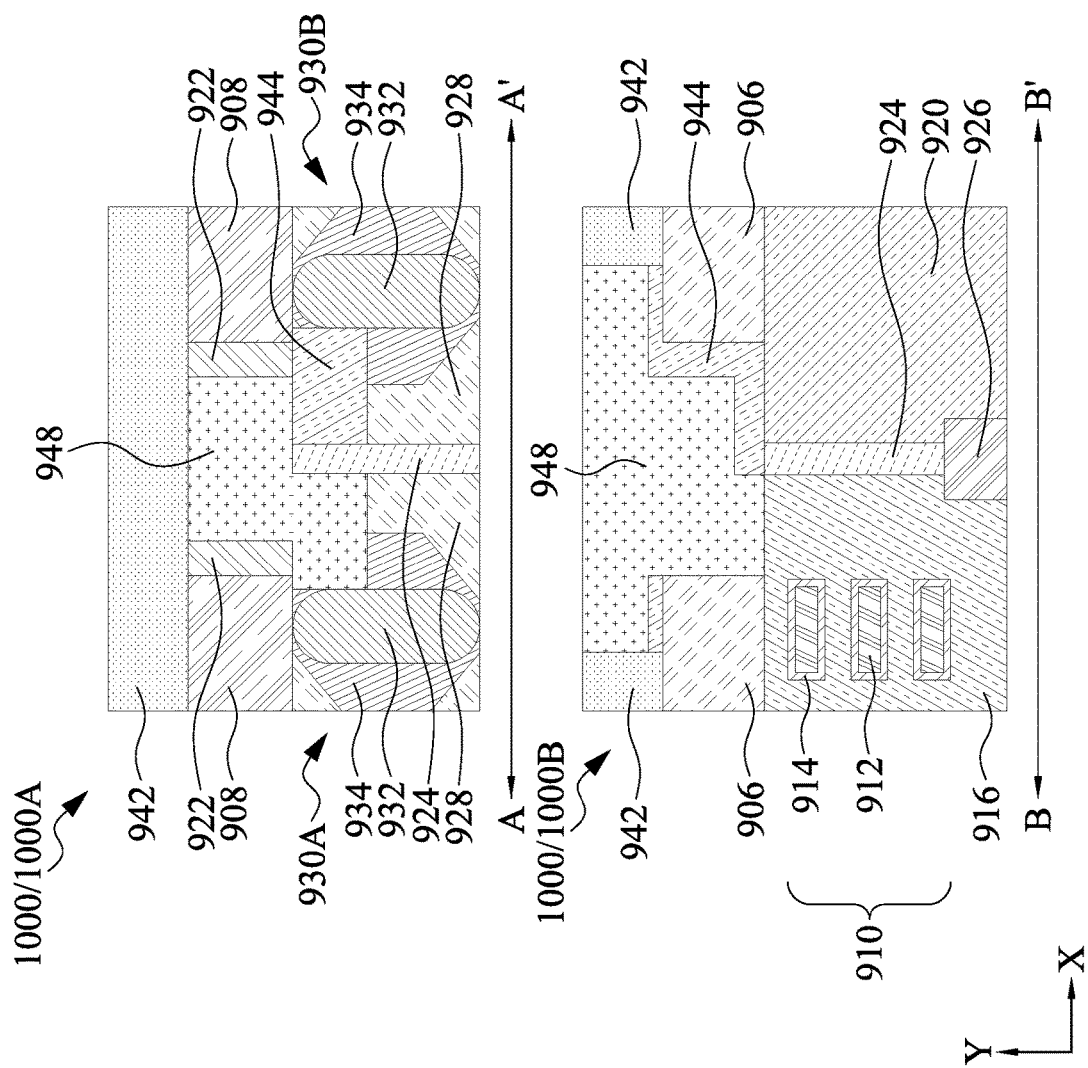
Figure 10C:
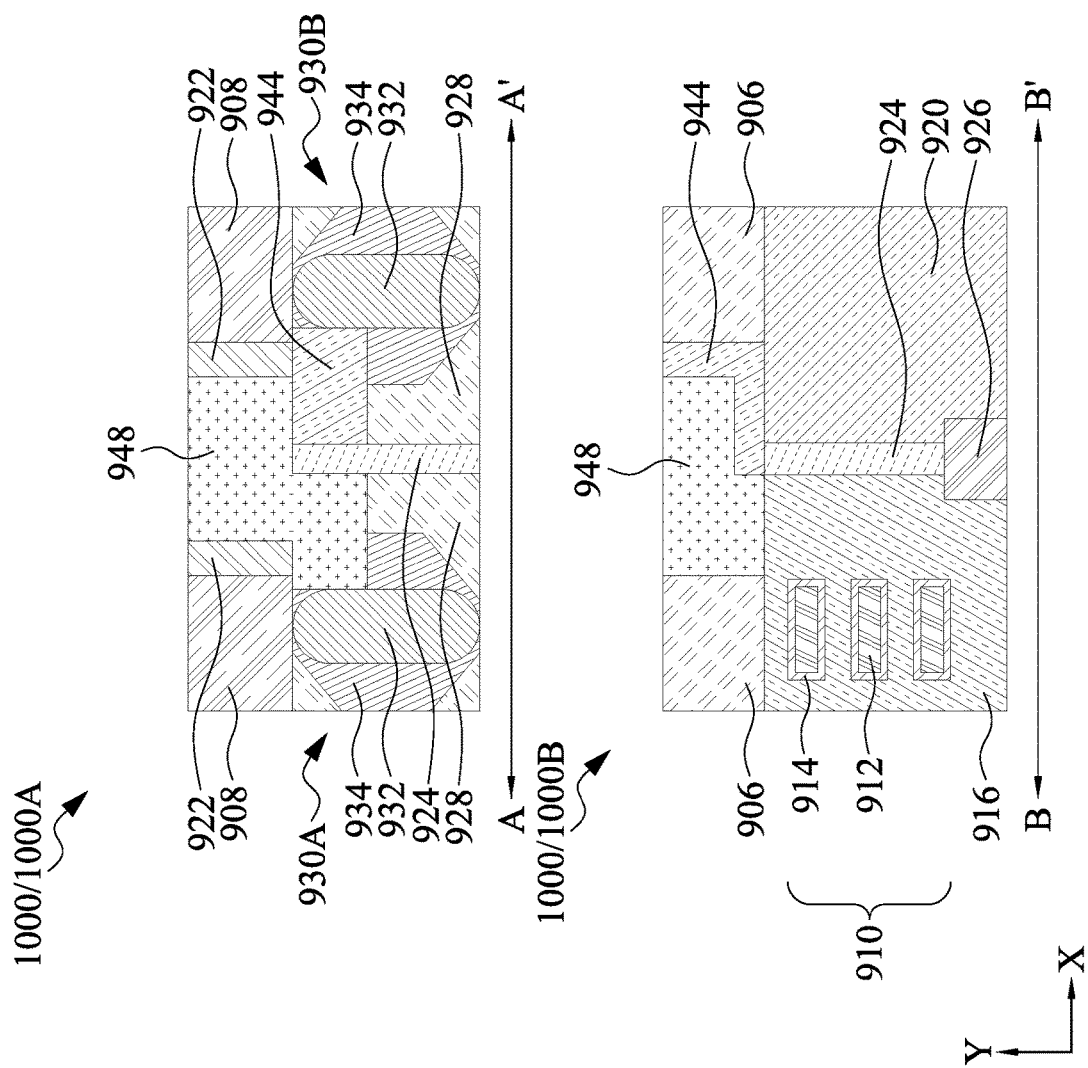

FIGS. 10A-10C are cross-sectional views 1000A and 1000B and design layouts 1000C of intermediate stages of manufacturing a semiconductor device 1000, in accordance with some embodiments of the present disclosure. The semiconductor device 1000 may include an electronic device, such as one or more of a NAND gate device, an inverter gate, an XOR gate, an AND gate, a NOR gate, an AOI gate, or other suitable logic gate devices. In some embodiments, the semiconductor device 1000 is a FinFET, a GAA FET, e.g., a nanosheet FET or a nanowire FET. The cross-sectional views 1000A and 1000B are drawn along sectional lines AA' and BB', respectively, of the design layout 900C. The design layout 1000C of the semiconductor device 1000 can be seen as an overlaid design layout incorporating the backside conductive via layer L4 and the backside power rail layer L5. In some embodiments, FIGS. 10A-10C are illustrated to show the formation of a backside tie-off conductive line from the backside of the semiconductor device 1000. As such, some aspects of manufacturing the semiconductor device 1000 may be simplified or omitted for the sake of clarity.

The method of manufacturing the semiconductor device 1000 proceeds from FIG. 9A to FIG. 9F, and the stage shown in FIG. 10A is performed following the stage shown in FIG. 9F. Referring to FIG. 10A, an etching operation is performed to extend the trench T2 downward to form a trench T4 that exposes the first gate structure 910. In some embodiments, the formation of the trench T4 keeps the first partition layer 924 or the second gate structure 920 covered by the protection layer 944. Referring to the design layout 1000C, a photomask PM3 is used to pattern the trench T4, in which the photomask PM3 includes a pattern PR3 exposing an area in the P-FET region around the first gate structure 910. A patterning operation is performed by etching through the protection layer 944 and exposing the gate structures 910 with the photomask PM3 as the etching mask. The etching operation may be performed using a dry etch, a wet etch, an RIE, or the like.

In some embodiments, the etching operation proceeds to a portion of the active region 202P (see FIG. 7) that is adjacent to the gate structure 910 and covered by the photomask PM3. The etching operation consumes portions of the dielectric layers 928 and the epitaxial region 930A under the isolation region 904, the spacer layers 922 and the backside conductive vias 908. Although the consumed portions of the dielectric layers 928 and the epitaxial region 930A are covered by the patterned mask layer 942, the etching starts from the exposed portions of the dielectric layers 928 and the epitaxial region 930A overlapped with the pattern PR3. Referring to the cross-sectional view 1000A, the etching continues in downward and lateral directions layer to extend the trench T4 to the isolation region 904 and the locations that are covered by the patterned mask layer 942 as denoted by the label T4. In some embodiments, the etched portion T4 consumes a corner of the epitaxial region 930A. As a result, the trench T4 communicates the upper surface of the first gate structure 910 to the sidewall of the epitaxial region 930A and the bottom surface of the backside conductive vias 908. In some embodiments, the etching operation includes an etchant selective to the material of the dielectric layers 928 with respect to the materials of the isolation region 906, the spacer layers 922, the backside conductive via 908 and the first partition layer 924 so that these regions apart from the dielectric layers 928 are kept unetched during the etching operation.

FIG. 10B illustrates the formation of the tie-off conductive line 948 in the trench T4. The tie-off conductive line 948 may be formed of a conductive material, e.g., tungsten, aluminum, titanium, tantalum, gold, silver, copper, alloys thereof, a combination thereof, or the like. The tie-off conductive line 948 may be formed by PVD, CVD, ALD, or the like. Therefore, the tie-off conductive line 948 electrically connects the first gate structure 910 to the epitaxial region 930A and the backside conductive via 908.

Referring to FIG. 10C, a planarization operation is performed to remove the mask layer 942 and upper portions of the tie-off conductive line 948 to expose the isolation region 906. The planarization operation may also level the upper surface of the tie-off conductive line 948 with the protection layer 944 and the isolation region 906.

In some embodiments, although not explicitly shown, the semiconductor device 1000 includes a backside power rail (e.g., the backside power rail 742 shown in FIG. 7) over the backside conductive via 908. As a result, the tie-off conductive line 948 can be connected to the overlying backside power rail through the backside conductive via 908, biased at the first supply voltage provided by the backside power rail, and tie off the first gate structure 910 accordingly.

Figure 11:
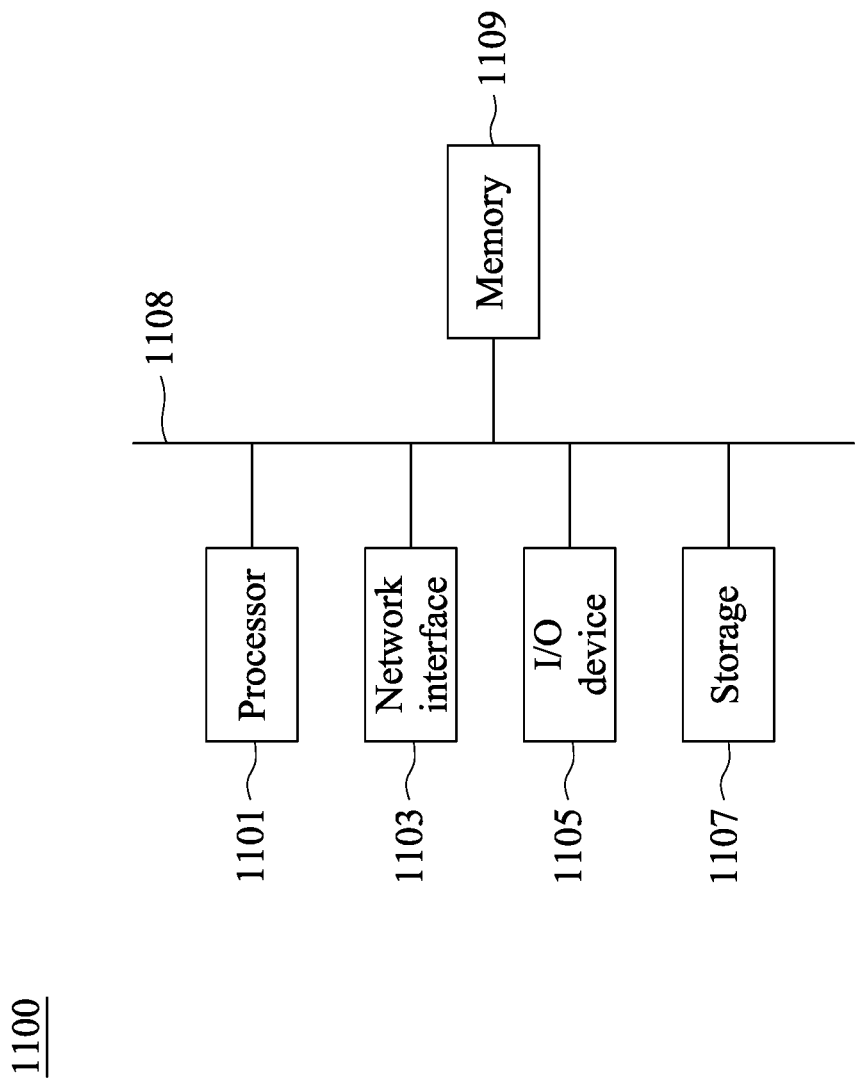
FIG. 11 is a schematic diagram of a system for implementing a design layout, in accordance with some embodiments.

FIG. 11 is a schematic diagram of a system 1100 for implementing or storing the design layouts discussed above, in accordance with some embodiments. The system 1100 includes a processor 1101, a network interface 1103, an input and output (I/O) device 1105, a storage device 1107, a memory 1109, and a bus 1108. The bus 1108 couples the network interface 1103, the I/O device 1105, the storage device 1107, the memory 1109 and the processor 1101 to each other.

The processor 1101 is configured to execute program instructions that include a tool configured to generate the design layouts as described and illustrated with reference to figures of the present disclosure.

The network interface 1103 is configured to access program instructions and data accessed by the program instructions stored remotely through a network (not shown).

The I/O device 1105 includes an input device and an output device configured for enabling user interaction with the system 1100. In some embodiments, the input device includes, for example, a keyboard, a mouse, and other devices. Moreover, the output device includes, for example, a display, a printer, and other devices.

The storage device 1107 is configured for storing the design layouts, program instructions and data accessed by the program instructions. In some embodiments, the storage device 1107 includes a standard cell library for storing the data of the standard cells and design data of the electronic circuits as discussed in the present disclosure. In some embodiments, the storage device 1107 includes a non-transitory computer-readable storage medium, for example, a magnetic disk and an optical disk.

The memory 1109 is configured to store program instructions to be executed by the processor 1101 and data accessed by the program instructions. In some embodiments, the memory 1109 includes any combination of a random-access memory (RAM), some other volatile storage device, a read-only memory (ROM), and some other non-volatile storage device.

According to an embodiment, a layout method, executed by at least one processor, includes: providing a library comprising a first cell and a second cell, wherein each of the first and second cells includes: a first active region and a second active region arranged in parallel and extending in a first direction in a first layer; a first cell-edge gate structure and a second cell-edge gate structure extending in a second direction on opposite sides of the first active region in a second layer over the first layer; and a third cell-edge gate structure and a fourth cell-edge gate structure extending in the second direction on opposite sides of the second active region in the second layer, where the first and second cell-edge gate structures have a first material different from a second material of the third and fourth cell-edge gate structures, wherein each of the first and second cell further includes one of a tie-off conductive line or a tie-off marker layer on each of the first and second cell-edge gate structures. The layout method further includes: generating a design layout by placing and abutting the first cell and the second cell; updating the design layout by performing a post-processing step on the tie-off conductive line and the tie-off marker layer of each of the first and second cells; and manufacturing a photomask according to the updated design layout.

According to an embodiment, a layout method, executed by at least one processor, includes: providing a library having a first cell and a second cell, wherein each of the first and second cells includes: a first active region and a second active region arranged in parallel and extending in a first direction in a first layer; a first cell-edge gate structure and a second cell-edge gate structure extending in a second direction on opposite sides of the first active region in a second layer over the first layer; and a first functional gate structure extending in the second direction between the first and second cell-edge gate structures, wherein each of the first and second cell further includes one of a tie-off conductive line or a tie-off marker layer on each of the first and second cell-edge gate structures. The layout method further includes: generating a design layout by placing and abutting the first cell and the second cell; updating the design layout by performing a post-processing step on the tie-off conductive line and the tie-off marker layer of each of the first and second cells; and manufacturing a photomask according to the updated design layout.

According to an embodiment; a layout method, executed by at least one processor, includes: providing a library having a first cell and a second cell, wherein each of the first and second cells includes: a first active region and a second active region arranged in parallel and extending in a first direction in a first layer; a first cell-edge gate structure and a second cell-edge gate structure extending in a second direction on opposite sides of the first active region in a second layer over the first layer; and a third cell-edge gate structure and a fourth cell-edge gate structure extending in the second direction on opposite sides of the second active region in the second layer, wherein each of the first and second cell further includes one of a tie-off conductive line or a tie-off marker layer on each of the first and second cell-edge gate structures. The layout method further includes: generating a design layout by placing and abutting the first cell and the second cell; updating the design layout by performing a post-processing step on the tie-off conductive line and the tie-off marker layer of each of the first and second cells, wherein the post-processing step determines whether there are two tie-off conductive lines or two tie-off marker layers are joined at a cell boundary between the first cell and the second cell; and manufacturing a photomask according to the updated design layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A layout method, executed by at least one processor, comprising:
    providing a library comprising a first cell and a second cell,
        wherein each of the first and second cells comprises:
            a first active region and a second active region arranged in parallel and extending in a first direction in a first layer;
            a first cell-edge gate structure and a second cell-edge gate structure extending in a second direction on opposite sides of the first active region in a second layer over the first layer; and
            a third cell-edge gate structure and a fourth cell-edge gate structure extending in the second direction on opposite sides of the second active region in the second layer, wherein the first and second cell-edge gate structures comprise a first material different from a second material of the third and fourth cell-edge gate structures,
        wherein each of the first and second cell further comprises one of a tie-off conductive line or a tie-off marker layer on each of the first and second cell-edge gate structures;
    generating a design layout by placing and abutting the first cell and the second cell;
    updating the design layout by performing a post-processing step on the tie-off conductive line and the tie-off marker layer of each of the first and second cells; and
    manufacturing a photomask according to the updated design layout.

2. The layout method according to claim 1, further comprising manufacturing an electronic circuit according to the photomask.

3. The layout method according to claim 1, wherein when the first cell abuts the second cell and a first tie-off marker layer on the first cell-edge gate structure of the first cell is joined with a second tie-off marker layer on the second cell-edge gate structure of the second cell, the post-processing step determines to convert the first and second tie-off marker layers on the first and second cell-edge gate structures into a tie-off conductive via in a third layer over the second layer on a first merged cell-edge gate structure between the first and second cells.

4. The layout method according to claim 3, wherein each of the first and second cells further comprises a power rail extending in the first direction in a fourth layer over the third layer, comprising electrically connecting the tie-off conductive via to the power rail.

5. The layout method according to claim 4, wherein the tie-off conductive via overlaps the power rail from a top-view perspective.

6. The layout method according to claim 1, wherein when the first cell abuts the second cell and at most one of a first tie-off marker layer and a second tie-off marker layer is present, wherein the first tie-off marker layer is arranged on the first cell-edge gate structure of the first cell and the second tie-off marker layer is arranged on the second cell-edge gate structure of the second cell, the post-processing step determines to remove the first and second tie-off marker layers from the design layout.

7. The layout method according to claim 6, wherein one of the first cell-edge gate structure of the first cell and the second cell-edge gate structure of the second cell is connected to one tie-off conductive line and the other is connected to one tie-off marker layer.

8. The layout method according to claim 7, wherein each of the first and second cells further comprises a power rail extending in the first direction in a fourth layer over the second layer, wherein the tie-off conductive line is non-overlapped with the power rail from a top-view perspective.

9. The layout method according to claim 1, wherein the first active region is a P-type active region.

10. The layout method according to claim 1, wherein the first material comprises a conductive material and the second material comprises a dielectric material.

11. The layout method according to claim 1, wherein when the first cell abuts the second cell, the first active region is contiguous across a cell boundary between the first cell and the second cell.

12. The layout method according to claim 1, wherein when the first cell abuts the second cell and the third cell-edge gate structure is merged with the fourth cell-edge gate structure as a second merged cell-edge gate structure, the second active region is separated by the second merged cell-edge gate structure.

13. A layout method, executed by at least one processor, comprising:
providing a library comprising a first cell and a second cell,
wherein each of the first and second cells comprises:
a first active region and a second active region arranged in parallel and extending in a first direction in a first layer;
a first cell-edge gate structure and a second cell-edge gate structure extending in a second direction on opposite sides of the first active region in a second layer over the first layer; and
a first functional gate structure extending in the second direction between the first and second cell-edge gate structures,
wherein each of the first and second cell further comprises one of a tie-off conductive line or a tie-off marker layer on each of the first and second cell-edge gate structures;
generating a design layout by placing and abutting the first cell and the second cell;
updating the design layout by performing a post-processing step on the tie-off conductive line and the tie-off marker layer of each of the first and second cells; and
manufacturing a photomask according to the updated design layout.

14. The layout method according to claim 13, wherein when the first cell abuts the second cell and a first tie-off conductive line on the first cell-edge gate structure of the first cell is joined with a second tie-off conductive line on the second cell-edge gate structure of the second cell, the post-processing step determines to remove the first and second tie-off conductive lines from the design layout.

15. The layout method according to claim 13, wherein the first cell-edge gate structure of the first cell is merged with the second cell-edge gate structure of the second cell to be a third merged cell-edge gate structure, wherein each of the first and second cells comprises:

a source/drain region in the first active region immediately adjacent to the third merged cell-edge gate structure;
a first power rail extending in the first direction in a third layer over the source/drain region; and
a conductive via electrically connecting the source/drain region to the first power rail.

16. The layout method according to claim 15, wherein the first power rail overlaps the conductive via of each of the first and second cells from a top-view perspective.

17. A layout method, executed by at least one processor, comprising:
providing a library comprising a first cell and a second cell,
wherein each of the first and second cells comprises:
a first active region and a second active region arranged in parallel and extending in a first direction in a first layer;
a first cell-edge gate structure and a second cell-edge gate structure extending in a second direction on opposite sides of the first active region in a second layer over the first layer; and
a third cell-edge gate structure and a fourth cell-edge gate structure extending in the second direction on opposite sides of the second active region in the second layer,
wherein each of the first and second cell further comprises one of a tie-off conductive line or a tie-off marker layer on each of the first and second cell-edge gate structures;
generating a design layout by placing and abutting the first cell and the second cell;
updating the design layout by performing a post-processing step on the tie-off conductive line and the tie-off marker layer of each of the first and second cells, wherein the post-processing step determines whether there are two tie-off conductive lines or two tie-off marker layers are joined at a cell boundary between the first cell and the second cell; and
manufacturing a photomask according to the updated design layout.

18. The layout method according to claim 17, wherein when each of the first and second cell comprises a conductive line layer in a third layer over the second layer, wherein the conductive line layer includes a first power rail, a second power rail, and a conductive line between the first and second power rails, wherein the tie-off conductive line overlaps the conductive line in the second direction.

19. The layout method according to claim 18, wherein each of the first and second cell further comprises backside power rail layer in a further layer on a side of the first layer opposite to the third layer, wherein the backside power rail layer includes a backside power rail electrically connected to the first or second cell-edge gate structure of each of the first and second cells.

20. The layout method according to claim 19, wherein the first power rail has a first width measured in the second direction, and the backside power rail has a second width measure in the second direction and greater than the first width.

* * * * *